(12) United States Patent
Bai

(10) Patent No.: US 8,737,942 B2
(45) Date of Patent: May 27, 2014

(54) METHOD AND SYSTEM FOR GENERATING ODD ORDER PREDISTORTIONS FOR A POWER AMPLIFIER RECEIVING CONCURRENT DUAL BAND INPUTS

(71) Applicant: Telefonaktiebolaget L M Ericsson (Publ), Stockholm (SE)

(72) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/079,237

(22) Filed: Nov. 13, 2013

(65) Prior Publication Data

US 2014/0073274 A1    Mar. 13, 2014

Related U.S. Application Data

(62) Division of application No. 13/351,121, filed on Jan. 16, 2012, now Pat. No. 8,606,197.

(51) Int. Cl.
*H01Q 11/12* (2006.01)
*H04B 1/04* (2006.01)

(52) U.S. Cl.
USPC ............. 455/127.4; 455/105; 455/114.3; 455/552.1; 375/296

(58) Field of Classification Search
USPC ............. 455/103–105, 114.2, 114.3, 455/127.1–127.4, 550.1, 552.1; 375/296, 375/297
See application file for complete search history.

(56) References Cited

U.S. PATENT DOCUMENTS

| | | | |
|---|---|---|---|
| 6,999,523 B2 | 2/2006 | Posti | |
| 7,149,257 B2 * | 12/2006 | Braithwaite | ............... 375/296 |
| 7,515,651 B1 | 4/2009 | Haddadin et al. | |
| 7,539,464 B2 | 5/2009 | Suzuki et al. | |
| 7,580,686 B2 * | 8/2009 | Fonden et al. | ............. 455/114.2 |
| 7,634,238 B2 | 12/2009 | Suzuki et al. | |
| 7,929,927 B2 * | 4/2011 | Norris et al. | ............... 455/114.3 |
| 8,391,809 B1 | 3/2013 | Fuller | |
| 8,412,132 B2 * | 4/2013 | Tang et al. | ................. 455/114.2 |
| 8,417,197 B2 | 4/2013 | Farahani Samani et al. | |
| 8,433,266 B2 * | 4/2013 | Tang et al. | ................. 455/127.1 |
| 2002/0021764 A1 | 2/2002 | Posti | |
| 2005/0168283 A1 | 8/2005 | Suzuki et al. | |

OTHER PUBLICATIONS

Bassam et al., "Linearization of Concurrent Dual-Band Power Amplifier Based on 2D-DPD Technique," IEEE Microwave and Wireless Components Letters, vol. 21(12), Dec. 2011 consisting of 4-pages.
Werquin et al., "Spurious Emissions Reduction using Multirate RF Transmitter," IEMN-ISEN, Lille, France consisting of 4-pages.
International Search Report and Written Opinion dated Apr. 3, 2013 for International Application No. PCT/IB2012/056807, International Filing Date: Nov. 28, 2012 consisting of 10-pages.

* cited by examiner

*Primary Examiner* — Nhan Le
(74) *Attorney, Agent, or Firm* — Christopher & Weisberg, P.A.

(57) ABSTRACT

A method and system for pre-distorting a dual band signal to compensate for distortion of a non-linear power amplifier in a radio transmitter are disclosed. In one embodiment, a first and second signal of the dual band signal are up-sampled at a sampling rate that is based at least in part on the bandwidth of at least one of the first and second signals and based at least in part on an intermediate frequency by which the first and second signal are tuned before pre-distortion of the tuned signals.

5 Claims, 10 Drawing Sheets

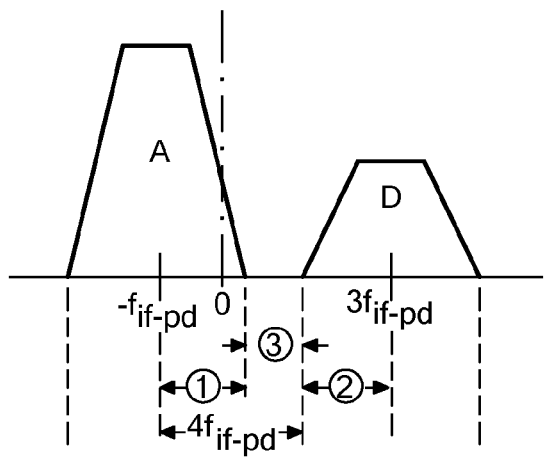
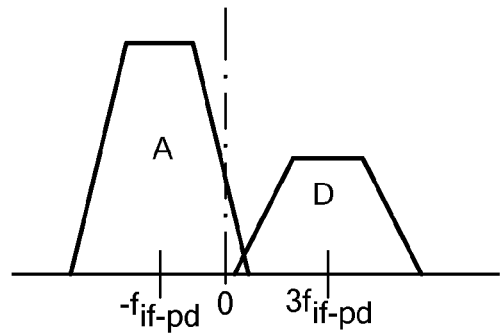
FIG. 11a  FIG. 11b
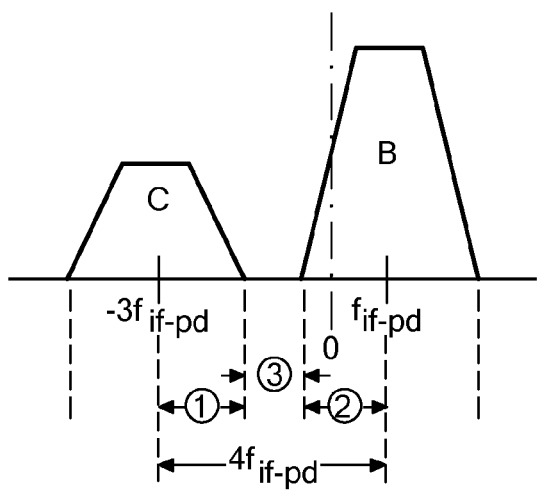
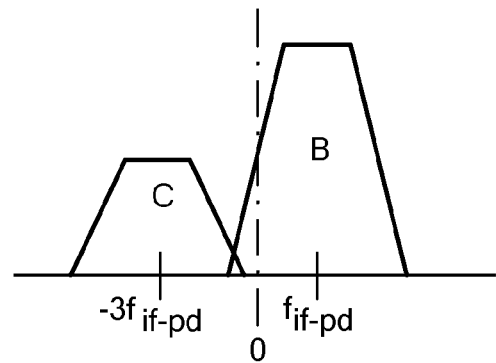
FIG. 12a  FIG. 12b

METHOD AND SYSTEM FOR GENERATING ODD ORDER PREDISTORTIONS FOR A POWER AMPLIFIER RECEIVING CONCURRENT DUAL BAND INPUTS

This application is a divisional of U.S. patent application Ser. No. 13/351,121, filed Jan. 16, 2012, entitled METHOD AND SYSTEM FOR GENERATING ODD ORDER PREDISTORTIONS FOR A POWER AMPLIFIER RECEIVING CONCURRENT DUAL BAND INPUTS, the entirety of which is incorporated herein by reference.

FIELD

The present invention relates to radio frequency (RF) transmitters and in particular to a pre-distortion method and system to compensate for non-linearities of a power amplifier in an RF transmitter.

BACKGROUND

A radio system includes a transmitter that transmits information-carrying signals to a receiver. The transmitter includes a power amplifier that operates to amplify the signal to be transmitted to a power level that is sufficient to enable receipt of the signal by the receiver. For the power amplifier to achieve high efficiency in terms of the ratio of peak power to average power, the power amplifier of a transmitter is operated in a non-linear region. This causes distortion of the input signal and broadening of the bandwidth of the input signal. To compensate for the distortion of the signal introduced by the power amplifier, the input signal is first passed through a pre-distorter that pre-distorts the input signal.

A typical pre-distorter is itself non-linear, having a non-linearity that compensates for the non-linearity of the pre-distorter. To illustrate, a power amplifier may exhibit first and third order effects characterized by a polynomial function of the input that may be written for third order non-linearities as:

$$y = f_{NL-IM3}(x) a_1 x + a_3 x^3 \quad \text{(AW-01)}$$

where x is the input signal and $a_3$ is much less than $a_1$. The function f is the response of the power amplifier to the input x and the subscript NL-IM3 denotes non-linearity up to order three. To compensate for the distortion introduced by the power amplifier, a pre-distorter may have a response that is a polynomial function of the input:

$$z = f_{PD-IM3}(x) = b_1 x + b_3 x^3 \quad \text{(AW-02)}$$

Substituting equation AW-02 into equation AW-01 leads to:

$$y = f_{NL-IM3}(f_{PD-IM3}(x)) = a_1 b_1 x + (a_1 b_3 + a_3 b_1^3) x^3 + O(x^5) \quad \text{(AW-03)}$$

where $O(x^5)$ are terms of 5th order or higher. By appropriate selection of the coefficients $b_1$ and $b_3$, the third order term may be removed, at the expense of creating higher order terms of less significant magnitude. The solution to achieve this is given by:

$$b_3 = -a_3 b_1^3 / a_1 \quad \text{(AW-04)}$$

Without loss of generality, assume that $a_1 = b_1 = 1$. Then the solution to compensate for third order distortions is:

$$b_3 = -a_3 \quad \text{(AW-05)}$$

This simple illustration is for third order non-linearities. For higher order non-linearities, the same approach may be taken to cancel the higher order terms. Thus, the pre-distorter is a non-linear device that compensates for the distortion caused by the power amplifier.

The bandwidth of the pre-distorter must be wider than the bandwidth of the input signal depending on the order of inter-modulation to be compensated by the pre-distorter. For example, for third order inter-modulations, the pre-distorted signal occupies about three times the bandwidth of the input signal to the pre-distorter. For fifth order inter-modulations, the pre-distorted signal occupies about 5 times the bandwidth of the input signal. Higher bandwidth implies that the sampling rate of the pre-distorted signal must be higher than the sampling rate of the sampled baseband signal from a modulator to avoid aliasing.

The problem of requiring a high sampling rate due to pre-distortion is exacerbated when the input signal is a dual band signal. Dual band signals arise when multiple wireless communication standards specify transmission using more than one frequency band, or when a single wireless communication standard specifies transmission using more than one frequency band. An up-converted dual band signal has a first continuous band at a first carrier frequency and a second continuous band at a second carrier frequency. The spacing between the carrier frequencies is such that the ratio of the carrier frequency spacing to the maximum individual bandwidth of a first or second band is very high so that a very large sampling rate is needed to avoid aliasing. A very high sampling rate is undesirable since a high clock rate may not be available within the system, and/or is more costly to implement, consumes additional power, etc.

What is needed is a method and system for pre-distorting a dual band signal that does not depend upon a sampling rate that is much higher than the sampling rate of a baseband signal of one of the two bands. More particularly, what is needed is a method and system for pre-distorting a dual band signal that provides a smaller sample rate than is required based on the carrier frequency, and provides a smaller intermediate frequency compared to the carrier frequency.

SUMMARY

The present invention advantageously provides a method and system for pre-distortion in a radio that transmits a dual band signal having a first signal substantially in a first band A and a second signal substantially in a second band B, comprising. The first signal is up-sampled at a sampling rate that is based at least in part on an intermediate frequency and a bandwidth of at least one of the first band and the second band to form a first up-sampled signal. The intermediate frequency is based at least in part on the bandwidth of at least one of the first band and the second band. The second signal is also up-sampled at the sampling rate to form a second up-sampled signal. The first up-sampled signal is tuned by the intermediate frequency to produce a first tuned signal. The second up-sampled signal is tuned by minus the intermediate frequency to produce a second tuned signal.

According to another aspect, the invention provides a dual band pre-distortion circuit for pre-distorting a first signal in a first frequency band and pre-distorting a second signal in a second frequency band. A first up-sampler up-samples the first signal according to a first up-sampling rate based at least in part on a bandwidth of at least one of the first signal and the second signal and based at least in part on an intermediate frequency to produce a first up-sampled signal. A second up-sampler up-samples the second signal according to the first up-sampling rate to produce a second up-sampled signal. A first tuner tunes the first signal by the intermediate frequency, the intermediate frequency being based at least in part on the bandwidth of a least one of the first signal and the second signal to produce a first tuned signal. A second tuner tunes the second signal by minus the intermediate frequency to produce a second tuned signal. A first adder adds the first tuned signal to the second tuned signal to produce a third signal. A second adder subtracts the first tuned signal from the second tuned signal to produce a fourth signal.

According to another aspect, the invention provides a method of pre-distortion of dual band signals in an RF front end of a radio. First and second signals of the dual band signal are up-sampled at a sampling rate based at least in part on a bandwidth of at least one of the first and second signals and an intermediate frequency. The intermediate frequency is based at least in part on the bandwidth of the at least one of the first and second signals. The first signal is tuned by minus the intermediate frequency to produce a first tuned signal. The second signal is tuned by plus the intermediate frequency to produce a second tuned signal.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 11a is a diagram of the signals in bands A and D near base band;

FIG. 11b is a diagram of aliasing of signals in bands A and D;

FIG. 12a is a diagram of the signals in bands B and C near baseband;

FIG. 12b is a diagram of aliasing of signals in bands B and C;

DETAILED DESCRIPTION

Figure 1:
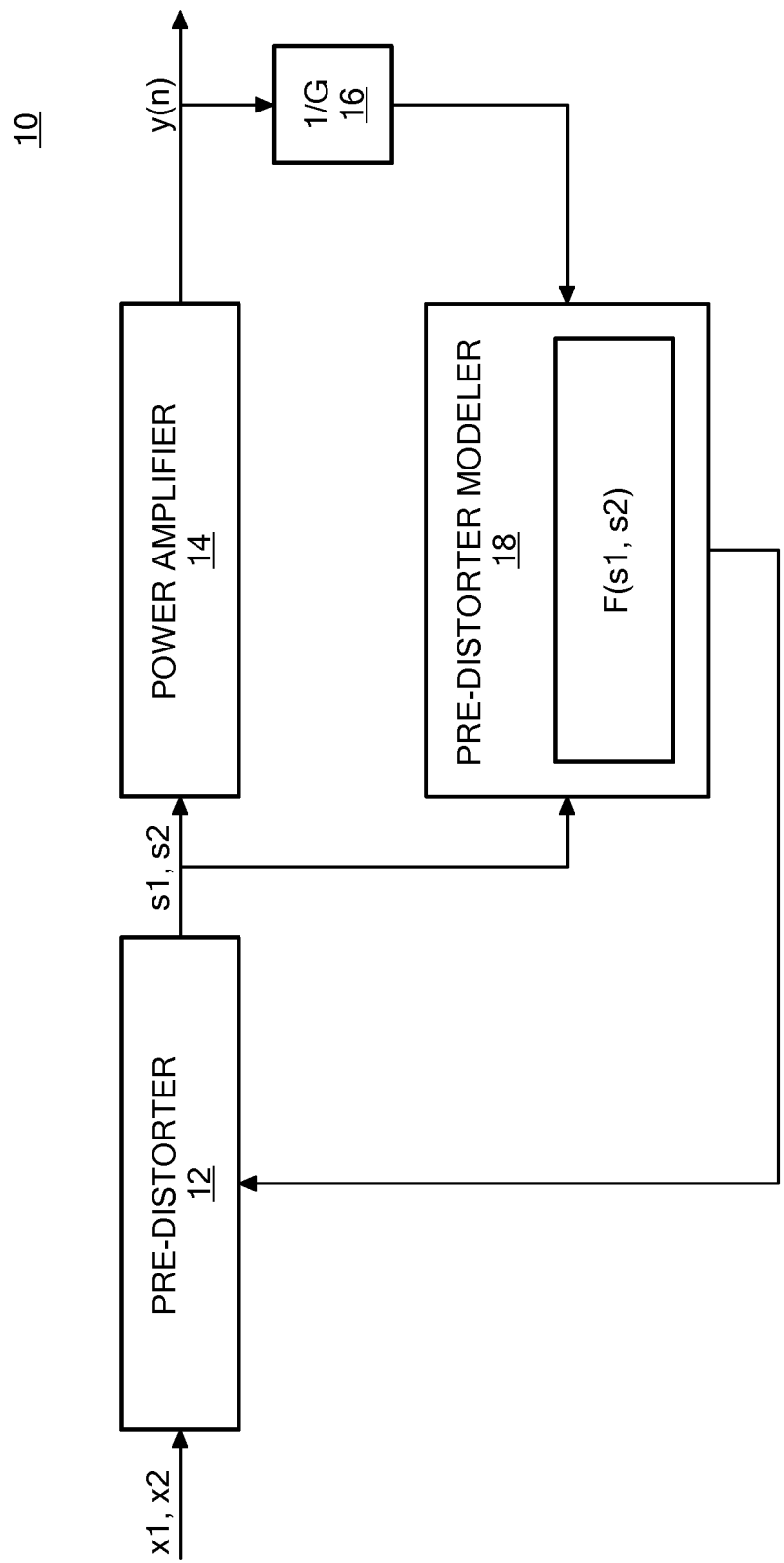
FIG. 1 is an exemplary block diagram of an RF transmitter front end constructed in accordance with principles of the present invention.

Before describing in detail exemplary embodiments that are in accordance with the present invention, it is noted that the embodiments reside primarily in combinations of apparatus components and processing steps related to signal pre-distortion in a radio of a wireless communication system. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1 an exemplary block diagram of a dual band pre-distortion architecture constructed in accordance with the present invention, and generally denoted as system "10". System 10 includes a pre-distorter 12, a power amplifier 14, a multiplier 16, and a pre-distorter modeler 18. The pre-distorter 12 receives a dual band signal including a first signal x1 having signal energy predominantly in a first band A and a second signal x2 having signal energy predominantly in a second band B. In one embodiment, the pre-distorter 12 includes two single-input pre-distorters that separately pre-distort a combination of the first and second signals according to a set of basis functions in each pre-distorter.

The outputs of the pre-distorter 12 are the pre-distorted signals s1 and s2. The pre-distorted signals are input to the power amplifier 14 and to the pre-distorter modeler 18. The power amplifier 14 amplifies and distorts the pre-distorted inputs. The pre-distorter coefficients and basis functions of the pre-distorter 12 are chosen by the pre-distorter modeler 18 so that the output of the power amplifier 14 is linearly related to the input signals x1 and x2 throughout an entire amplification range of the power amplifier 14. To accomplish this linearity, the pre-distorter modeler 18 receives the pre-distorted signals s1 and s2 and the output of the power amplifier 14 divided by the amplifier gain G by the multiplier 16.

Figure 2:
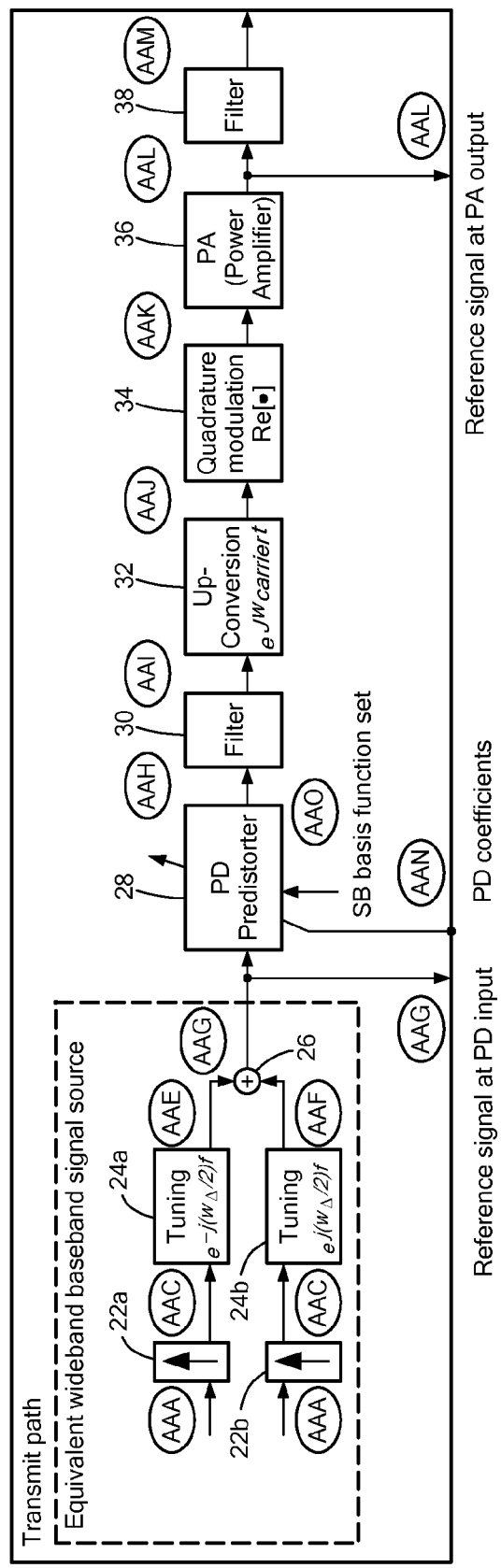
FIG. 2 is an exemplary block diagram of a wideband single band transmitter with a single-band pre-distorter constructed in accordance with principles of the present invention.

A single band pre-distortion architecture 20 is shown in FIG. 2. The exemplary pre-distortion architecture 20 can be the pre-distorter 12 of FIG. 1. In FIG. 2, each oval label with letters designates a signal at a particular point in the circuit. For example, reference designator AAA denotes a first baseband signal having a frequency spectrum predominantly within a first band A. The reference designator AAB denotes a second baseband signal having a frequency predominantly within a second band B.

The first baseband signal is up-sampled by a first up-sampler 22a to produce a first up-sampled signal AAC denoted as:

$$s_{bb,band-A}(n) \quad \text{(AA-01)}$$

The second baseband signal is up-sampled by a second up-sampler 22b to produce a second up-sampled signal AAD denoted as:

$$s_{bb,band-B}(n) \quad \text{(AA-02)}$$

In equations AA-01 and AA-02, the subscript bb denotes baseband, the subscript A denotes band A and the subscript B denotes band B.

The first up-sampled baseband signal is tuned by a first tuner 24a to a first intermediate frequency to obtain a first tuned signal AAE obtained as follows:

$$s_{sb,if,band-A}(n) = s_{bb,band-A}(n) \cdot \exp(-j\pi f_{delta} n T_s) \quad \text{(AA-03)}$$

The second up-sampled baseband signal is tuned by a second tuner 24b to minus the first intermediate signal to obtain a second tuned signal AAF obtained as follows:

$$s_{sb,if,band-B}(n) = s_{bb,band-B}(n) \cdot \exp(j\pi f_{delta} n T_s) \quad \text{(AA-04)}$$

In equations AA-03 and AA-04, the subscript "sb" denotes single band and the subscript "if" denotes an intermediate frequency.

These signals are summed by an adder 26 to obtain an equivalent baseband signal AAG obtained as follows:

$$s_{sb,bb}(n) = s_{sb,if,band-A}(n) + s_{sb,if,band-B}(n) \quad \text{(AA-05)}$$

This signal is input to a pre-distorter 28 which pre-distorts the signal to produce a pre-distorted signal AAH as follows:

$$s_{sb,bb,pd}(n) = f_{pd}(S_{sb,bb}(n)) \quad \text{(AA-06)}$$

In equation AA-06, f is a pre-distortion function which is defined below. The subscript pd of the signal AAH $s_{sb,bb,pd}(n)$ denotes that the signal is predistorted. The pre-distorter 28 also receives a set of pre-distortion coefficients AAN denoted as a vector $w_{sb,bb}(n)$ and a set of basis functions AAO denoted as a vector function $F_{sb,bf}(\cdot)$. The coefficients AAN and basis functions AAO will be described subsequently in this application.

Considering only third order non-linearities, the pre-distorted signal AAH $s_{sb,bb,pd}(n)$ has energy primarily in four frequency bands as follows:

$$s_{bb,pd,band-A}(n) \cdot \exp(-j\pi f_{delta} n T_s) \quad \text{(AA-07)}$$

$$s_{bb,pd,band-B}(n) \cdot \exp(j\pi f_{delta} n T_s) \quad \text{(AA-08)}$$

$$s_{bb,pd,band-C}(n) \cdot \exp(j3\pi f_{delta} n T_s) \quad \text{(AA-09)}$$

$$s_{bb,pd,band-D}(n) \cdot \exp(j3\pi f_{delta} n T_s) \quad \text{(AA-10)}$$

It follows that the signal AAH can be expressed as:

$$s_{sb,bb,pd}(n) = s_{bb,pd,band-A}(n) \cdot \exp(-j\pi f_{delta} n T_s) + \\ s_{bb,pd,band-B}(n) \cdot \exp(j\pi f_{delta} n T_s) + \\ s_{bb,pd,band-C}(n) \cdot \exp(-j3\pi f_{delta} n T_s) + \\ s_{bb,pd,band-D}(n) \cdot \exp(j3\pi f_{delta} n T_s) \quad \text{(AA-11)}$$

Note that the indexing of the bands are in an order of increasing absolute value of their center frequency and in an order of negative then positive bands. Thus, the bands from left to right are labeled C then A then B then D. Both alphabetical indexing and numerical indexing may be used interchangeably herein. Thus, band A and band 1 refer to the same band, band B and band 2 refer to the same band, band C and band 3 refer to the same band, and band D and band 4 refer to the same band.

The signal AAH may be input to a band pass filter 30, which filters out the portion of the signal AAH that is in the band C and that is in the band D to produce a new signal AAI as follows:

$$s_{sb,bb,pd,band-AB}(n) = s_{bb,pd,band-A}(n) \cdot \exp(-j\pi f_{delta} n T_s) + \\ s_{bb,pd,band-B}(n) \cdot \exp(j\pi f_{delta} n T_s) \quad \text{(AA-12)}$$

The subscript band-AB denotes that the signal exhibits energy primarily in band A and in band B.

The signal AAI is up-converted by an up-converter 32 to a carrier frequency $f_c$ to produce a signal AAJ as follows:

$$s_{sb,bb,pd,band-AB} \cdot \exp(j2\pi f_c T_s)$$

The signal AAJ is input to a quadrature modulator 34 to produce a quadrature modulated signal AAK as follows:

$$s_{sb,rf,pd,band-AB}(n) = \text{Re}\big[s_{sb,bb,pd,band-AB} \cdot \exp(j2\pi f_c T_s)\big] \quad \text{(AA-13)}$$

$$= \text{Re}\big[s_{sb,bb,pd,band-AB}(n)\big]\cos(j2\pi f_c T_s) - \\ \text{Im}\big[s_{sb,bb,pd,band-AB}(n)\big]\sin(j2\pi f_c T_s)$$

The subscript "rf" denotes that the signal is a radio frequency (RF) signal centered at the carrier frequency. The signal AAK is input to the power amplifier 36 to produce an amplified RF signal AAL as follows:

$$G_{pa} \cdot s_{sb,rf,nl-pd}(n) = G_{pa} \cdot f_{nl}(s_{sb,rf,nl-pd,band-AB}(n)) \quad \text{(AA-14)}$$

where $G_{pa}$ is the gain of the power amplifier and $f_{nl}$ denotes the non-linear function of the power amplifier 36.

In the above equations, the following notations are used: $f_{c1}$ and $f_{c2}$ are the carrier frequencies of first band A and second band B, respectively; $bw_1$ and $bw_2$ are the bandwidths of the baseband signals for the first band A and the second band B, respectively; $f_{delta} = (f_{c2} - f_{c1})$ is the frequency span between the carrier frequencies of the two bands, A and B; $f_c = (f_{c2} + f_{c1})/2$ is the carrier frequency of a dual band signal that is considered as a single band wideband signal consisting of both bands A and B. The bandwidth of such a single band wideband signal is given by $f_{delta} + (bw_1 + bw_2)/2$. Such a single band wideband signal is input to the power amplifier 36 in the single band pre-distortion architecture 20.

In blocks 24a and 24b of FIG. 2, the intermediate frequency for pre-distortion is chosen to be $f_{if-pd} = f_{delta}/2$. The bandwidth of the pre-distorted signal is 3 to 5 times the bandwidth of the single band wideband signal given by $f_{delta} + (bw_1 + bw_2)/2$, when considering distortions of $3^{rd}$ and $5^{th}$ order. Accordingly, the pre-distorter 28 of architecture 20 should operate at a sample frequency of 3 to 5 times the bandwidth given by $f_{delta} + (bw_1 + bw_2)/2$. Thus, the sampling rate is at least $3f_{delta}$ to $5f_{delta}$.

It is noted that the intermediate frequency $f_{if-pd}$ may be chosen to be much less than half the carrier frequency span $f_{delta}/2$ so that the sample rate of the signal in the pre-distorter need not be as high as proportional to the carrier frequency span $f_{delta}$. In other words, it is desirable that the intermediate frequency in elements 24a and 24b, as well as the sampling rate in the pre-distorter 28, are only functions of the parameters $bw_1$ and $bw_2$, and not a function of $f_{delta}$.

Once again considering only third order non-linearities, due to the non-linearity of the power amplifier 26, the signal AAL has energy in bands C and D as well as bands A and B. Thus, the signal AAL is filtered by a filter 38 to produce the output signal AAM as follows:

$$G_{pa} \cdot s_{sb,rf,nl-pd,band-AB}(n) \quad \text{(AA-20)}$$

where $$s_{sb,rf,nl-pd,band-AB}(n) = s_{sb,rf,nl-pd,band-A}(n) + \\ s_{sb,rf,nl-pd,band-B}(n) \quad \text{(AA-21)}$$

Because of the pre-distortion applied to the signal by the pre-distorter 28 to compensate for the distortion introduced by the power amplifier 36, there is a substantially linear relationship between the signal AAG and the signal AAM.

Figure 3:
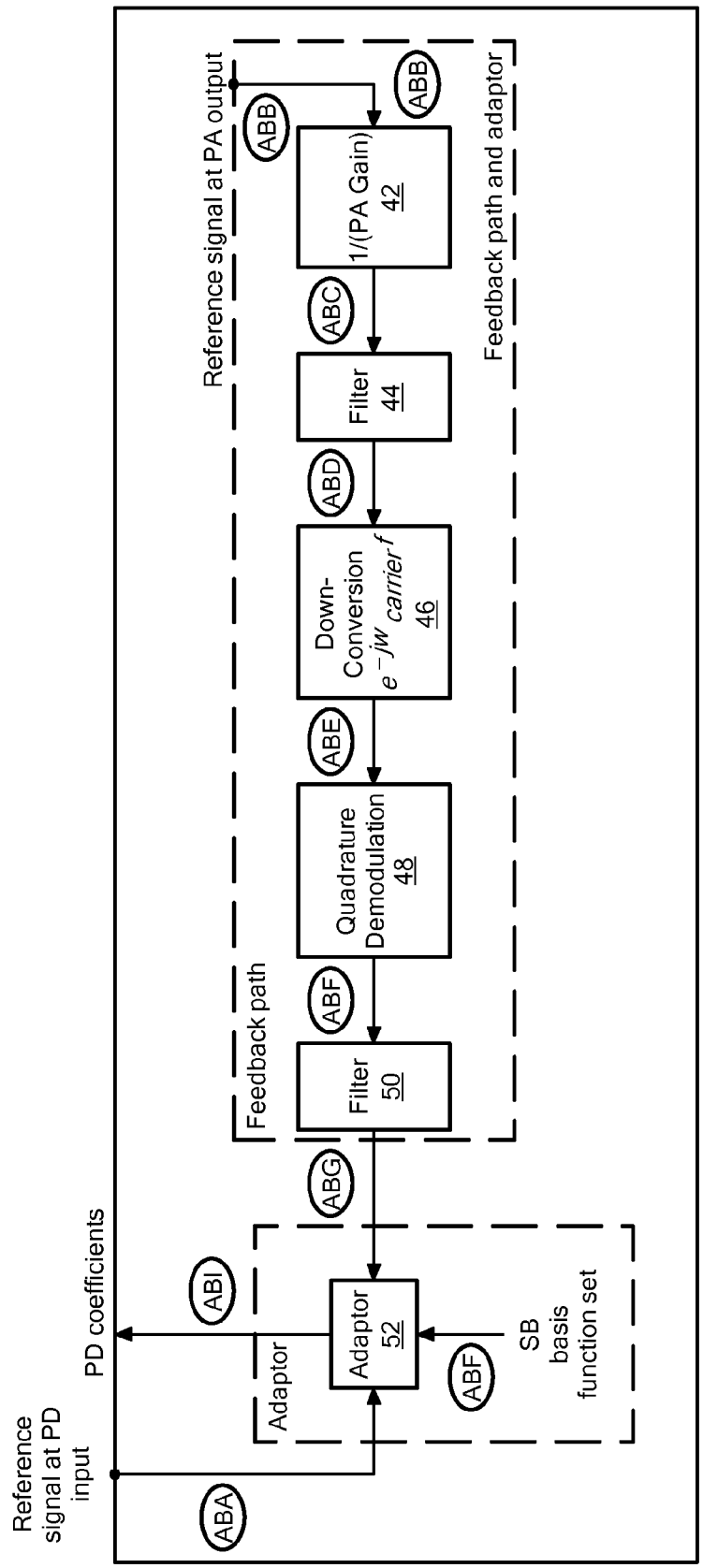
FIG. 3 is an exemplary block diagram of a pre-distortion modeler usable in conjunction with the wideband single band transmitter of FIG. 2.

FIG. 3 shows an exemplary pre-distortion modeler circuit 40, which can be the pre-distorter modeler 18 of FIG. 1. Circuit 40 receives two input signals labeled ABA and ABB. The input signal ABA is the same as the signal AAG given by equation AA-05, i.e., the input to the pre-distorter 28, repeated here for convenience:

$$s_{sb,bb}(n) \quad \text{(AB-01)}$$

The input signal ABB is the output signal AAL from the power amplifier 36 of FIG. 2 given by equation AA-20, repeated here for convenience:

$$G_{pa} \cdot s_{sb,rf,nl\text{-}pd}(n)$$

The signal ABB is normalized by dividing by the Gain ($G_{pa}$) of the power amplifier 36 by a multiplier, amplifier, or attenuator 42 to yield the signal ABC, expressed as:

$$s_{sb,rf,nl\text{-}pd}(n) \quad \text{(AB-03)}$$

Note that in some embodiments, the output of the power amplifier 36 may be coupled to the input ABB of FIG. 3 via an RF coupler. The signal ABC may be obtained via an attenuator 42, as noted. The signal ABC is input to a filter 44. Filter 44 filters the signal ABC to substantially filter out energy in the bands C and D to produce signal ABD as follows:

$$s_{sb,rf,nl\text{-}pd,band\text{-}AB}(n) \quad \text{(AB-04)}$$

This is the signal given by equation AA-21. The signal ABD is input to a down converter 46 which down converts by $-f_c$ to produce a baseband signal ABE given by:

$$s_{sb,rf,nl\text{-}pd,band\text{-}AB}(n) \cdot \exp(-j2\pi f_c) \quad \text{(AB-05)}$$

This signal has a baseband component centered at DC and an out-of-band component centered at $2f_c$, which can be expressed as:

$$s_{sb,rf,nl\text{-}pd,band\text{-}AB}(n) \cdot \exp(-j2\pi f_c) = s_{sb,bb,nl\text{-}pd,band\text{-}AB}(n) + s_{sb,rf\text{-}oob\text{-}nl\text{-}pd,band\text{-}AB}(n) \quad \text{(AB-06)}$$

The signal ABE is quadrature-demodulated by a quadrature demodulator 48 to produce an intermediate signal ABF, which in turn is filtered by filter 50 to remove the out-of-band component at $2f_c$, to produce a signal ABG, which is the desired feedback signal given by:

$$s_{sb,bb,nl\text{-}pd,band\text{-}AB}(n) \quad \text{(AB-07)}$$

The signal ABG is input to the adaptor 52. The adaptor also receives the signal ABA given by AB-01 above:

$$s_{sb,bb}(n) \quad \text{(AB-01)}$$

The adaptor 52 further receives the basis function set ABH which are the same basis functions AAO $F_{sb,bf}(\cdot)$ given above as input to the pre-distorter 28. The output of the adapter 52 is the set of coefficients ABI which are the same coefficients AAN $w_{sb,bb}(n)$ given above as input to the pre-distorter 28.

Figure 4:
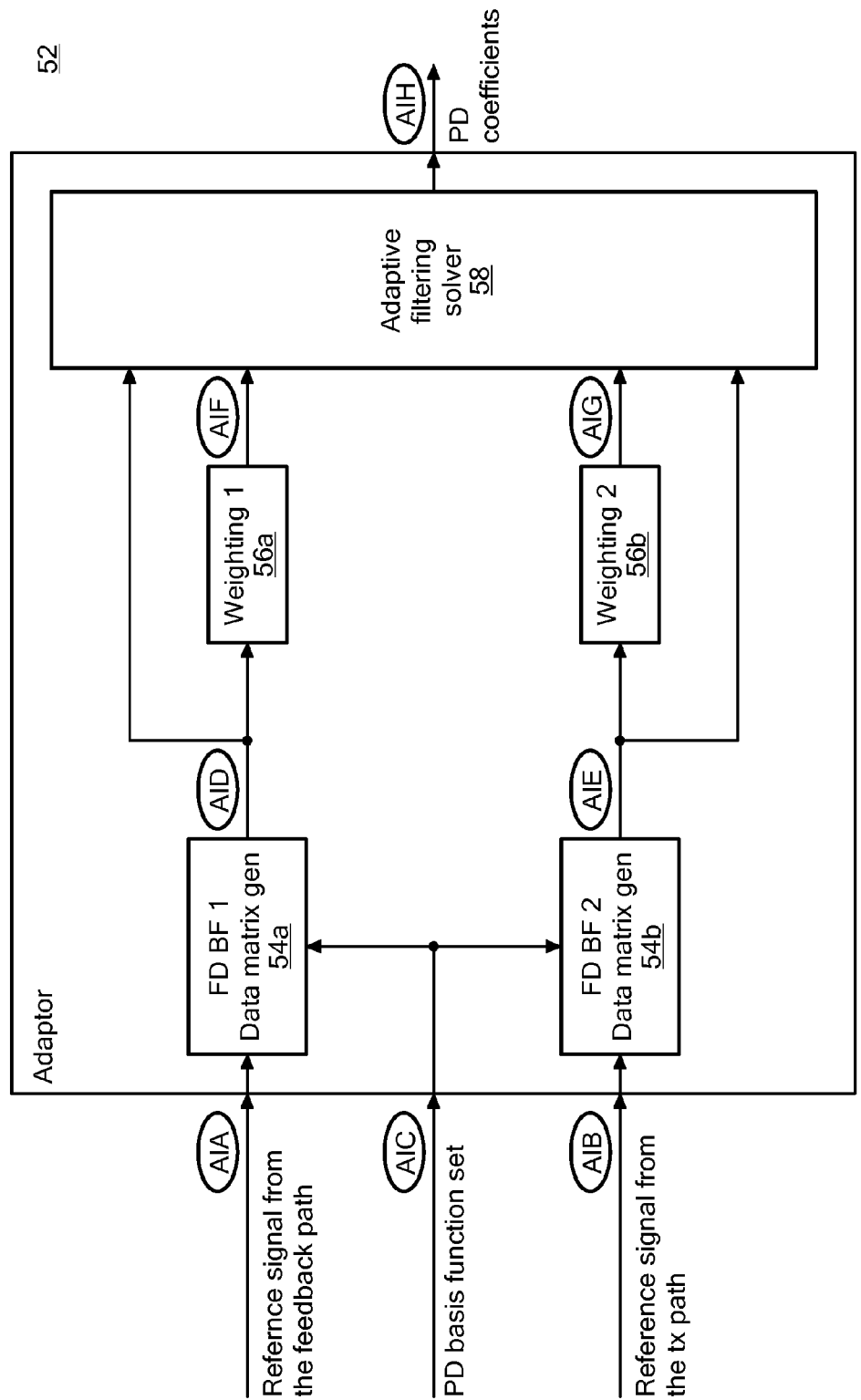
FIG. 4 is an exemplary block diagram of an adaptor for computing coefficients for a pre-distorter constructed in accordance with principles of the present invention.

FIG. 4 shows a more detailed view of the adaptor 52. As discussed above, the adaptor 52 has three inputs:

$$AIA = ABG = s(n) \quad \text{(AI-01)}$$

$$AIB = ABA = s'(n) \quad \text{(AI-02)}$$

$$AIC = ABH = F_{sb,bf}(\cdot) \quad \text{(AI-05)}$$

The reference signal $s(n)$ is input to a first data matrix generator 54a to produce a first matrix AID given by:

$$A_i = [a(n_0), a(n_1), \ldots, a(n_{N-1})]^T \quad \text{(AI-06)}$$

where $$a(n) = F_{bf}(s(n)) \quad \text{(AI-05)}$$

$$a(n) = [a_0(n), a_1(n), \ldots, a_{P-1}(n)]^T \quad \text{(AI-04)}$$

$$= [f_{bf,0}(s(n)), f_{bf,1}(s(n)), \ldots, f_{bf,P-1}(s(n))]^T$$

$a(n)$ is a PX1 vector, superscript T denotes the transpose operation, and $A_i$ is an NXP matrix, and where $$a_p(n) = f_{bf,p}(s(n)) \quad \text{(AI-03)}$$

The matrix $A_1$ are the responses of the basis function set to the input $s(n)$ over $n = n_0, n_1 \ldots n_{N-1}$, where N is the number of samples used for adaptation iteration i, where i is the iteration index.

The reference signal $s'(n)$ is input to a second data matrix generator 54b to produce a second matrix AIE given by:

$$A'_i = [a'(n_0), a'(n_1), \ldots, a'(n_{P-1})]^T \quad \text{(AI-07)}$$

where $$a'(n) = F_{bf}(s'(n)) \quad \text{(AI-08)}$$

The signal AID of equation AI-06 is input to a first multiplier 56a which multiplies the signal AID by a set of weights, w, as follows:

$$A_i \cdot w_i = b_i = [b(n_0), b(n_1), \ldots, b(n_{N-1})]^T \quad \text{(AI-09)}$$

where $$w_i = [w_{i,0}, w_{i,1}, \ldots, w_{i,P-1}]^T \quad \text{(AI-10)}$$

vector b is an Nx1 vector, w is a PX1 vector, and the signal AIF is $$b(n) = \sum_{p=0}^{P-1} a_p(n) \cdot w_{i,p} \quad \text{(AI-11)}$$

The signal AIF $b(n)$ is the weighted summation of the responses of the basis function set to the input $s(n)$.

Similarly, the signal AIE of equation AI-07 is input to a second multiplier 56b which multiplies the signal AIE by the set weights, w, as follows:

$$A'_i \cdot w_i = b'_i = [b'(n_0), b'(n_1), \ldots, b'(n_{N-1})]^T \quad \text{(AI-12)}$$

where the signal AIG is $$b'(n) = \sum_{p=0}^{P-1} a'_p(n) \cdot w_{i,p} \quad \text{(AI-13)}$$

The vector $b'(n)$ is readily available from the transmit path of FIG. 2 as signal AAH, namely, the output of the pre-distorter 28. Thus, the blocks between MB and MG may be omitted, with the signal AIG being obtained from the pre-distorter 28.

The weights $w_{i+1}$ are calculated by an adaptive solver 58 by solving the following equation for $w_{i+1}$:

$$A_i \cdot w_{i+1} = b'_i \quad \text{(AI-14)}$$

where the subscript of $w_{i+1}$ means iteration i+1. The output of the adaptive solver 58 is labeled AIH and is an input AAN to the pre-distorter 28.

Figure 5:
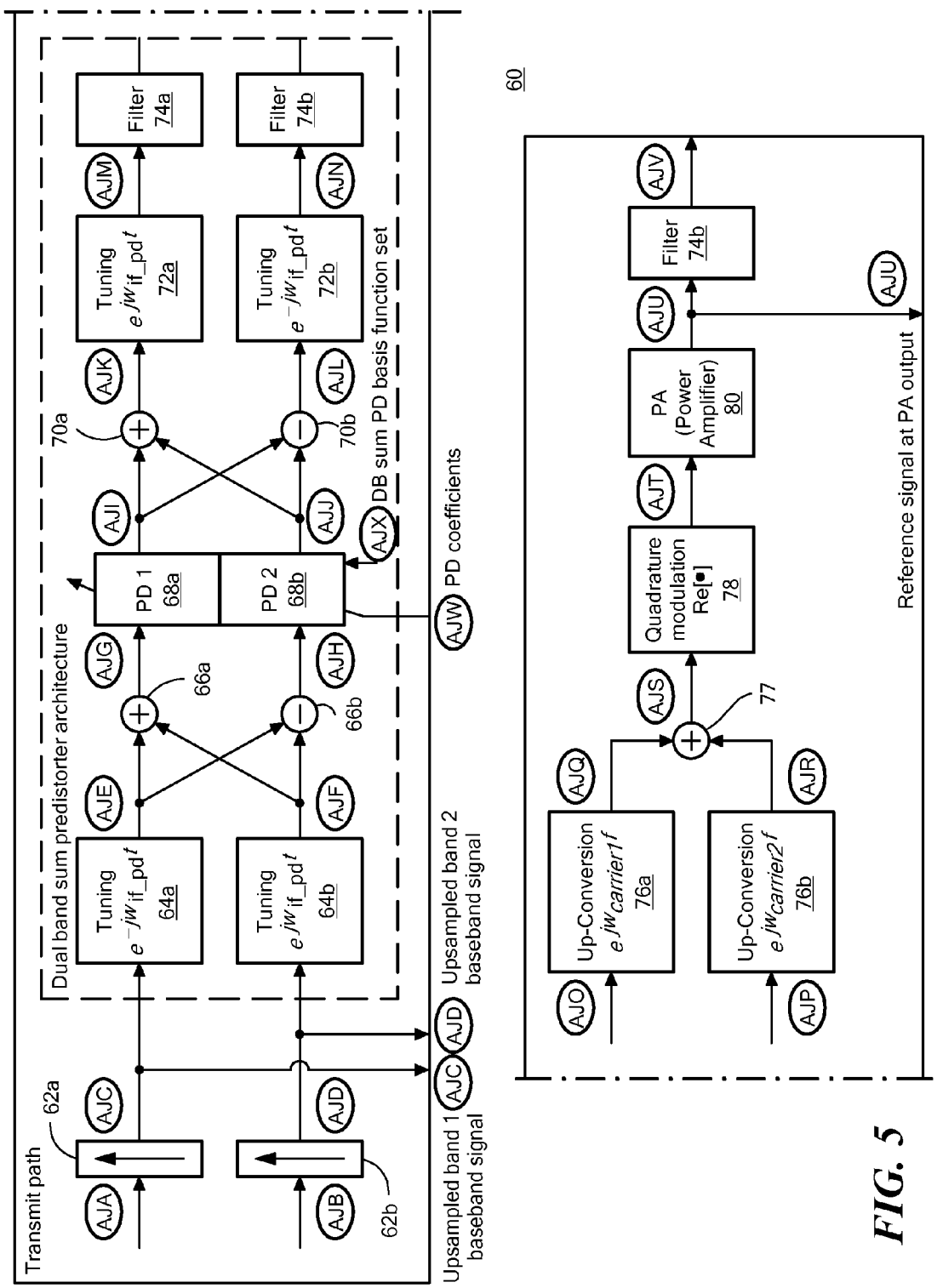
FIG. 5 is an exemplary block diagram of an dual band sum pre-distortion architecture constructed in accordance with principles of the present invention.

FIG. 5 is a block diagram of an exemplary embodiment of a dual band sum pre-distortion transmit circuit 60, which includes the pre-distorter 12 of FIG. 1. The reference designator AJA denotes a first baseband signal having a frequency spectrum predominantly within a first band A. The reference designator AJB denotes a second baseband signal having a frequency predominantly within a second band B.

The first baseband signal is up-sampled by a first up-sampler 62a to produce a first up-sampled signal AJC denoted as:

$$s_{bb,band\text{-}A}(n) \quad \text{(AJ-01)}$$

where, the subscript bb denotes baseband and band-A indicates the signal energy is predominantly in band A. The second baseband signal is up-sampled by a second up-sampler 62b to produce a second up-sampled signal AJD denoted as:

$$s_{bb,band-B}(n) \quad \text{(AJ-02)}$$

These two up-sampled signals are then tuned to an intermediate frequency (IF) by tuners 64a and 64b to produce signals AJE and AJF, respectively as follows:

$$S_{db\text{-}sum02,if,band\text{-}A}(n) = s_{bb,band\text{-}A}(n) \cdot \exp(-j2\pi f_{if\text{-}pd} nT_s) \quad \text{(AJ-03)}$$

$$S_{db\text{-}sum02,if,band\text{-}B}(n) = s_{bb,band\text{-}B}(n) \cdot \exp(j2\pi f_{if\text{-}pd} nT_s) \quad \text{(AJ-04)}$$

where the subscript db-sum02 denotes the architecture of FIG. 5, the subscript "if" denotes an intermediate frequency signal, $f_{if\text{-}pd}$ is the intermediate frequency used in the pre-distorter, and $T_s$ is the sampling period. The signal AJE is added to the signal AJF by an adder 66a to produce the signal AJG as follows:

$$S_{db\text{-}sum02,bb,band\text{-}AB,1}(n) = S_{db\text{-}sum02,if,band\text{-}A}(n) + S_{db\text{-}sum02,if,band\text{-}B}(n) \quad \text{(AJ-05)}$$

This is signal AJG is input to a first pre-distorter 68a. The signal AJE is subtracted from the signal AJF by an adder 66b to produce the signal AJH as follows:

$$S_{db\text{-}sum02,bb,band\text{-}AB,2}(n) = S_{db\text{-}sum02,if,band\text{-}A}(n) - S_{db\text{-}sum02,if,band\text{-}B}(n) \quad \text{(AJ-06)}$$

The signal AJH is input to a second pre-distorter 68b.

The predistorters 68a and 68b receive the same coefficients AJW and the same basis functions AJX. Thus, the pre-distorters have identical structures. The coefficients are:

$$w_{db\text{-}sum02,bb,band\text{-}AB}(n) \quad \text{(AJ-37)}$$

and the basis functions are:

$$F_{db\text{-}sum02,bf,band\text{-}AB}(\cdot) \quad \text{(AJ-38)}$$

The outputs of the pre-distorters 68a and 68b are the signals AJI and AJJ, given by:

$$s_{db\text{-}sum02,bb,pd,band\text{-}AB,1}(n) = f_{db\text{-}sum02,pd}(S_{db\text{-}sum02,bb,band\text{-}AB,1}(n)) \quad \text{(AJ-07)}$$

$$s_{db\text{-}sum02,bb,pd,band\text{-}AB,2}(n) = f_{db\text{-}sum02,pd}(S_{db\text{-}sum02,bb,band\text{-}AB,2}(n)) \quad \text{(AJ-08)}$$

where the subscript "pd" indicates the signal is pre-distorted. The functions $f_{db\text{-}sum02,pd}$ are the basis functions, AJX, which are input to the adaptor 52 (signal AIC) and the pre-distorters 68a and 68b. Note that in the sum pre-distortion architecture of FIG. 5, the pre-distorters only produce odd order terms. Thus, every term of the pre-distorter basis functions is either an odd power of $S_{db\text{-}sum02,if,band\text{-}A}(n)$ and an even power of $S_{db\text{-}sum02,if,band\text{-}B}(n)$ or an even power of $S_{db\text{-}sum02,if,band\text{-}A}(n)$ and an odd power of $S_{db\text{-}sum02,if,band\text{-}B}(n)$. The latter terms in $s_{db\text{-}sum02,bb,pd,band\text{-}AB,2}(n)$ all bear a factor of an odd order power of minus one.

The signals AJI and AJJ are summed by an adder 70a to produce the signal AJK as follows:

$$s_{db\text{-}sum02,if,pd,band\text{-}A\text{-}odd}(n) = S_{db\text{-}sum02,bb,pd,band\text{-}AB,1}(n) + S_{db\text{-}sum02,bb,pd,band\text{-}AB,2}(n) \quad \text{(AJ-09)}$$

In the signal AJK, pre-distortions in band B and even bands are cancelled, whereas pre-distortions in band A and odd bands are obtained.

The signals AJI and AJJ are subtracted by an adder 70b to produce the signal AJL as follows:

$$s_{db\text{-}sum02,if,pd,band\text{-}B\text{-}even}(n) = S_{db\text{-}sum02,bb,pd,band\text{-}AB,1}(n) - S_{db\text{-}sum02,bb,pd,band\text{-}AB,2}(n) \quad \text{(AJ-10)}$$

In the signal AJL, pre-distortions in band A and odd bands are cancelled, whereas pre-distortions in band B and even bands are obtained.

The signal AJK is input to a tuner 72a to produce a signal AJM as follows:

$$s_{db\text{-}sum02,if,pd,band\text{-}odd}(n) \cdot \exp(j2\pi f_{if\text{-}pd} nT_s) \quad \text{(AJ-18)}$$

The tuner 72a brings the signal in band A down to baseband. The signal AJL is input to a tuner 72b to produce a signal AJN as follows:

$$s_{db\text{-}sum02,if,pd,band\text{-}even}(n) \cdot \exp(-j2\pi f_{if\text{-}pd} nT_s) \quad \text{(AJ-20)}$$

The tuner 72b brings the signal in band B to baseband. The output AJM of the tuner 72a is input to a filter 74a to filter out all but the pre-distorted signal in band A to produce the signal AJO. The output AJN of the tuner 72b is input to a filter 74b to filter out all but the pre-distorted signal in band B to produce the signal AJP. Thus, the signals AJO and AJP are as follows:

$$s_{db\text{-}sum02,bb,pd,band\text{-}A}(n) = s_{bb,pd,band\text{-}A}(n) \quad \text{(AJ-24)}$$

$$s_{db\text{-}sum02,bb,pd,band\text{-}B}(n) = s_{bb,pd,band\text{-}B}(n) \quad \text{(AJ-25)}$$

The signals AJO and AJP are up-converted by up-converters 76a and 76b, respectively to produce the signals AJQ and AJR as follows:

$$s_{db\text{-}sum02,bb,pd,band\text{-}A}(n) \cdot \exp(j2\pi f_{c1} nT_s) \quad \text{(AJ-26)}$$

$$s_{db\text{-}sum02,bb,pd,band\text{-}B}(n) \cdot \exp(j2\pi f_{c2} nT_s) \quad \text{(AJ-27)}$$

These signals are added by an adder 77 to produce the signal AJS. The signal AJS is input to a quadrature modulator 78 to produce the signal AJT as follows:

$$\begin{aligned}
s_{db\text{-}sum02,rf,pd,band\text{-}AB}(n) &= \text{Re}[s_{db\text{-}sum02,bb,pd,band\text{-}A}(n) \cdot \\
&\quad \exp(2j\pi f_{c1} nT_s)] + \\
&\quad \text{Re}[s_{db\text{-}sum02,bb,pd,band\text{-}B}(n) \cdot \\
&\quad \exp(2j\pi f_{c2} nT_s)] \\
&= \text{Re}[s_{db\text{-}sum02,bb,pd,band\text{-}A}(n)] \\
&\quad \cos(j2\pi f_{c1} T_s) - \\
&\quad \text{Im}[s_{db\text{-}sum02,bb,pd,band\text{-}A}(n)] \\
&\quad \sin(j2\pi f_{c1} T_s) + \\
&\quad \text{Re}[s_{db\text{-}sum02,bb,pd,band\text{-}B}(n)] \\
&\quad \cos(j2\pi f_{c2} T_s) - \\
&\quad \text{Im}[s_{db\text{-}sum02,bb,pd,band\text{-}B}(n)] \\
&\quad \sin(j2\pi f_{c2} T_s)
\end{aligned} \quad \text{(AJ-28)}$$

where "rf" denotes that the signal is a radio frequency (RF) signal at carriers $f_{c1}$ and $f_{c2}$.

The signal AJT is input to the power amplifier 80 to produce a distorted pre-distorted RF signal AJU as follows:

$$G_{pa} \cdot s_{db\text{-}sum02,rf,nl\text{-}pd}(n) = G_{pa} \cdot f_{nl}(s_{db\text{-}sum02,rf,nl\text{-}pd,band\text{-}AB}(n)) \quad \text{(AJ-29)}$$

where $G_{pa}$ is the gain of the power amplifier 80 and $f_{nl}$ is the normalized (memoryless) non-linear function of the power amplifier. The signal AJU has components in four frequency bands A, B, C, and D. as follows:

$$s_{db\text{-}sum02,rf,nl\text{-}pd}(n) = s_{db\text{-}sum02,rf,nl\text{-}pd,band\text{-}A}(n) + s_{db\text{-}sum02,rf,nl\text{-}pd,band\text{-}B}(n) + s_{db\text{-}sum02,rf,nl\text{-}pd,band\text{-}C}(n) + s_{db\text{-}sum02,rf,nl\text{-}pd,band\text{-}D}(n) \quad \text{(AJ-34)}$$

This signal is filtered by a filter 82 to produce the desired output signal AJV given by:

$$G_{pa} \cdot s_{db\text{-}sum02,rf,nl\text{-}pd,band\text{-}AB}(n) \quad \text{(AJ-35)}$$

where $$s_{db\text{-}sum02,rf,nl\text{-}pd,band\text{-}AB}(n) = s_{db\text{-}sum02,rf,nl\text{-}pd,band\text{-}A}(n) + s_{db\text{-}sum02,rf,nl\text{-}pd,band\text{-}B}(n) \quad \text{(AJ-36)}$$

Figure 6:
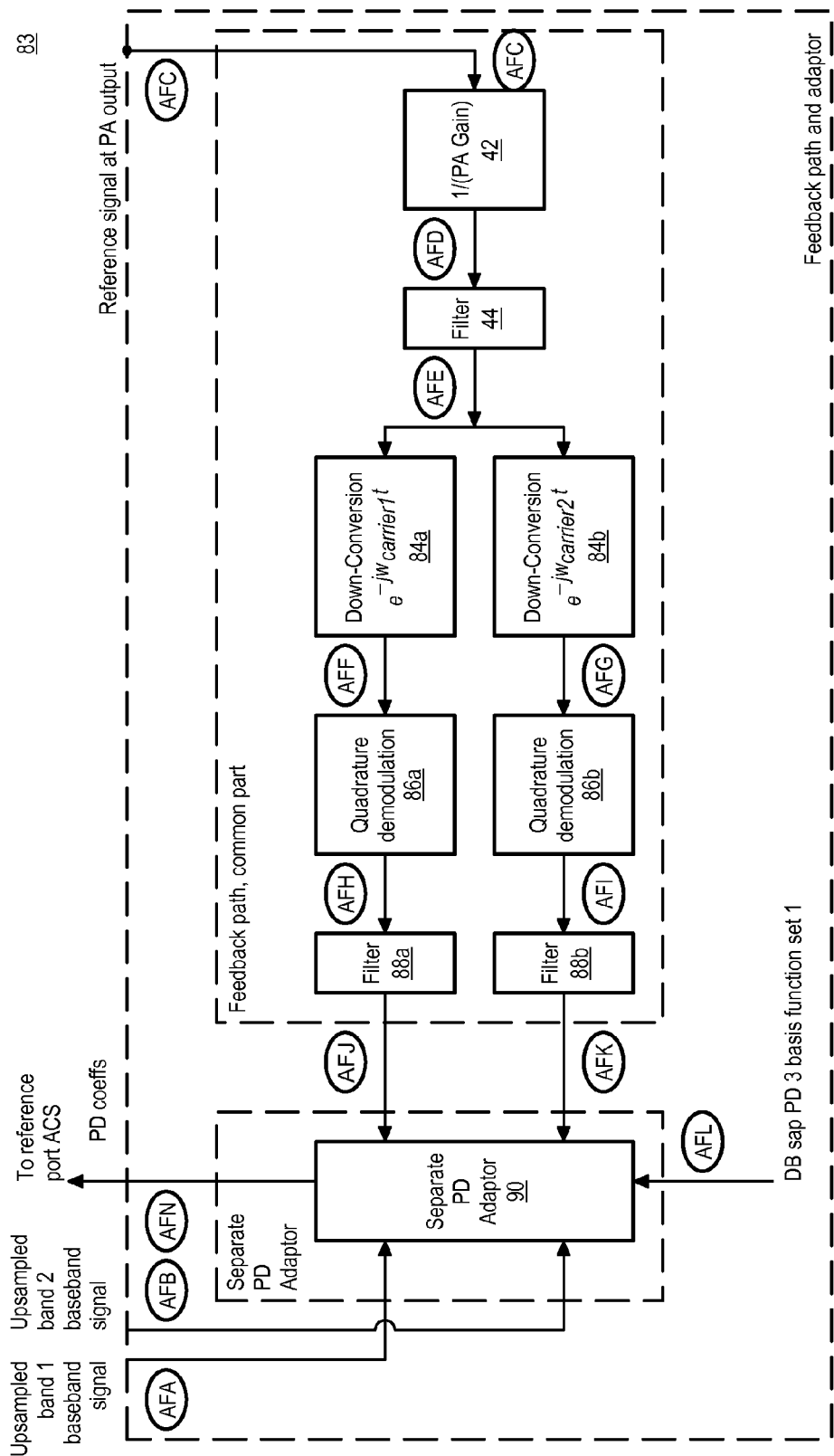
FIG. 6 is an exemplary block diagram of a pre-distortion modeler usable in conjunction with the architecture of FIG. 5.

FIG. 6 shows a pre-distortion modeler circuit 83 used in conjunction with the dual band sum pre-distortion transmit circuit 60, such as the pre-distorter modeler 18 of FIG. 1. Circuit 81 has three inputs, AFA, AFB and AFC. The input signal AFA is the signal AJC from circuit 60. The input signal AFB is the signal AJD from circuit 60. The input signal AFC is the output signal AJU from the power amplifier 80 in FIG. 5.

The input signal AFC is normalized by the gain of the power amplifier 80 by a multiplier 42. The output of the multiplier 42 is labeled signal AFD and is input to a filter 44 to produce signal AFE. Signal AFE is split and sent to down-converters 84a and 84b to produce down-converted baseband signals AFF and AFG. The down-converted signals AFF and AFG are demodulated by quadrature demodulators 86a and 86b, respectively, to produce demodulated signals AFH and AFI. These signals are filtered by filters 88a and 88b, respectively to produce signals AFJ and AFK, which are input to the adaptor 90.

Adaptor 90 operates as described above with reference to FIG. 4, except that the adaptor receives two inputs AFJ and AFK from the feedback path and receives two inputs AFA and AFB from the transmitter circuit 60. The data matrix generators of adaptor 90 apply the basis function set AFL to compute a function F that has two arguments for a pair of signals $s_1, s_2$. That is, one data matrix generator receives the inputs AFJ and AFK and computes the function F of these two signals, and another data matrix generator receives the inputs AFA and AFB and computes the function F of these two signals. The output of the adaptor is the set of coefficients AJW input to the pre-distorters 68a and 68b of FIG. 5.

Figure 7:
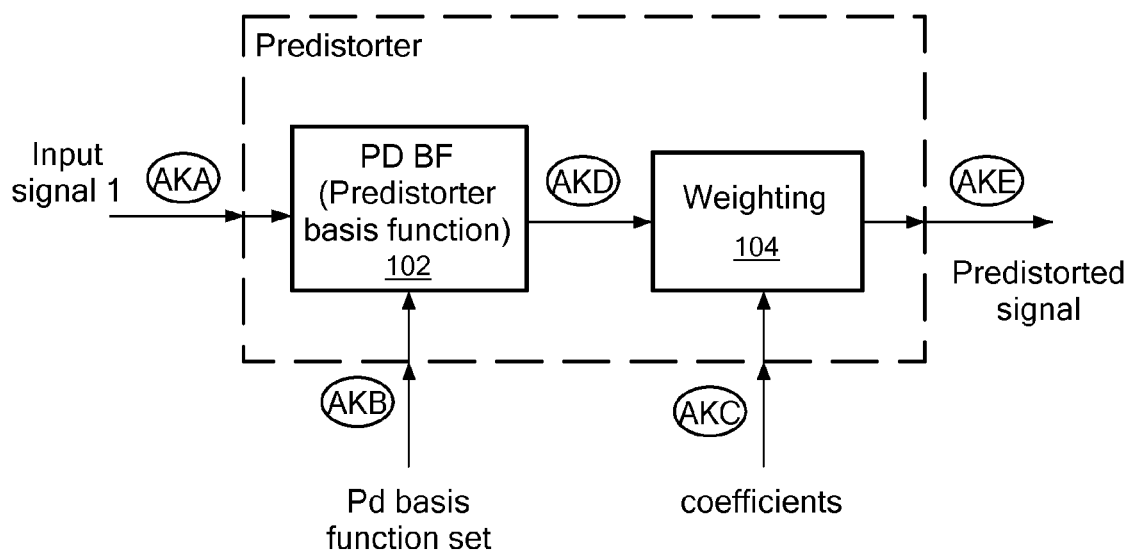
FIG. 7 is an exemplary block diagram of a single-input pre-distorter constructed in accordance with principles of the present invention.

FIG. 7 is a block diagram of the pre-distorters 68a and 68b of FIG. 5. The pre-distorter 68 has pre-distortion unit 102 that receives the signal labeled AKA, which corresponds to the signal AJG or AJH of FIG. 5. The pre-distortion unit 102 also receives the basis functions AKB, $F_{bf}(\cdot)$, which correspond to the basis functions AJK of FIG. 5 and AIC of FIG. 4. The output AKD of the pre-distortion unit 102 is input to a multiplier 104 which multiplies the signal AKD by the coefficients AKC, w, which correspond to the coefficients AIH of FIG. 4, and the coefficients AJW of FIG. 5.

The pre-distortion unit 102 performs the following operation on the input signal AKA:

$$a_{bb,p}(n) = f_{bf,p}(s_{bb}(n)) \quad \text{(AK-02)}$$

for each basis function, where $f_{bf,p}$ is the p-th basis function in the basis function set at input AKB, $s_{bb}(n)$ is the input signal AKA which is the same as the signal of equation AJ-05, and $a_{bb,p}(n)$ is the response of the basis function to the signal $s_{bb}(n)$. Note that P is the number of basis functions corresponding to the order of non-linearity to be corrected. For example, if correction of non-linear terms of order 3 are to be corrected, then P=2. If correction of non-linear terms of order 5 are to be corrected, then P=3.

Thus, the output of the pre-distortion unit 102 is a vector, as follows:

$$a_{bb}(n) = [a_{bb,0}(n), a_{bb,1}(n), \ldots, a_{bb,P-1}(n)]^T \quad \text{(AK-03)}$$
$$= [f_{bf,0}(s_{bb}(n)), f_{bf,1}(s_{bb}(n)), \ldots, f_{bf,P-1}(s_{bb}(n))]^T$$

which can be written compactly as follows:

$$a_{bb}(n) = F_{bf}(s_{bb}(n)) \quad \text{(AK-04)}$$

The weights (coefficients) AKC are given by the vector, w, as follows:

$$w = [w_0, w_1, \ldots, w_{P-1}]^T \quad \text{(AK-05)}$$

The multiplier 104 performs the following operation to produce the output signal AKE, which corresponds to the output AJI of the pre-distorter 68a or the output AJJ of the pre-distorter 68b of FIG. 5, as follows:

$$b_{bb}(n) = \sum_{p=0}^{P-1} a_{bb,p}(n) \cdot w_p = a_{bb}(n)^T \cdot w \quad \text{(AK-06)}$$

Principles of the architecture of FIG. 5 are discussed below using simplified notation for clarity. Baseband signals in band A and band B tuned to intermediate frequencies are denoted as "a" and "b", respectively. The signals a and b correspond to the signals AJE and AJF, respectively. Then a third order non-linear term is:

$$(a+b)^3 = a^3 + 3a^2b + 3ab^2 + b^3$$

It has been observed that:
$a^3$ contributes to the frequency components in band A only;
$3a^2b$ contributes to the frequency components in band B and C only;
$3ab^2$ contributes to the frequency components in band A and D only; and
$b^3$ contributes to the frequency components in band B only.
Therefore, the following signals may be constructed:

$$c = ((a+b)^3 + (a-b)^3)/2 = a^3 + 3ab^2; \text{ and}$$

$$d = ((a+b)^3 - (a-b)^3)/2 = 3a^2b + b^3.$$

Signals c and d correspond to the signals AJI and AJJ, respectively, of FIG. 5. Signal c contains the contents of bands A and D, and signal d contains the contents of bands B and C. Compared to generating $(a+b)^3$, generating c and d allows a lower minimum sampling rate to be achieved. This is because there are only signals in 2 bands instead of 4 bands in the output. Further, the spacing between signals of bands A and D can be more closely spaced, and the signals of bands B and C can be more closely spaced. The minimum sampling rate and the minimum IF frequency, $f_{if\text{-}pd}$, are discussed below.

Figure 8:
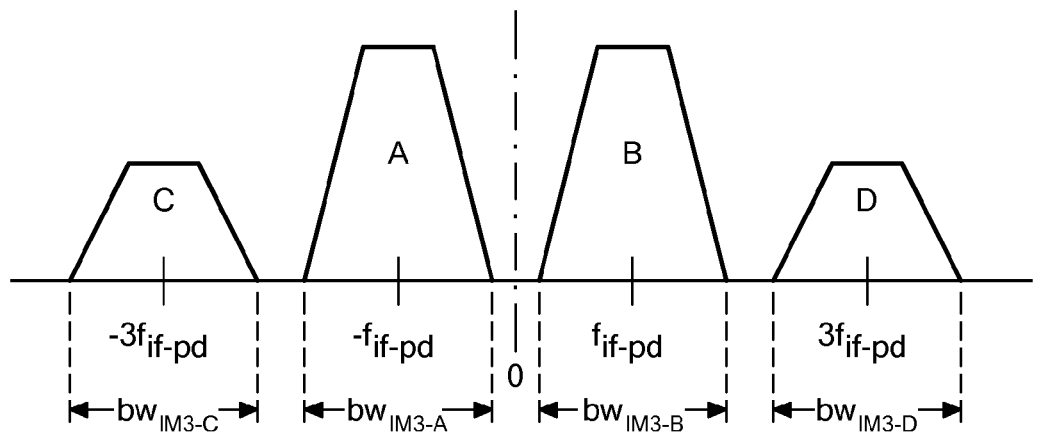
FIG. 8 is diagram of a pre-distorted signal having signals in 4 bands.

FIG. 8 is an illustration of exemplary signals produced by a pre-distorter such as the pre-distorter 68a or 68b for third order non-linear effects. FIG. 8 shows signals in bands C, A, B, and D, with the desired signals in bands A and B. In particular, band C is centered at $-3f_{if\text{-}pd}$, band A is centered at $-f_{if\text{-}pd}$, band B is centered at $+f_{if\text{-}pd}$, and band D is centered at $+3f_{if\text{-}pd}$. Thus, the distorted signal contains frequency components in 4 bands, as follows:

$$\text{Band } A, \text{centered at } f_{c1}, \text{span:} bw_{IM3\_A} = bw_1 + 2\max(bw_1, bw_2) \quad \text{(AU-01)}$$

$$\text{Band } B, \text{centered at } f_{c2}, \text{span:} bw_{IM3\_B} = bw_2 + 2\max(bw_1, bw_2) \quad \text{(AU-02)}$$

Band $C$, centered at $2^*f_{c1}-f_{c2}$, span: $bw_{IM3\_C}=2bw_1+bw_2$ (AU-03)

Band $D$, centered at $2^*f_{c2}-f_{c1}$, span: $bw_{IM3\_D}=bw_1+bw_2$ (AU-04)

Figure 9:
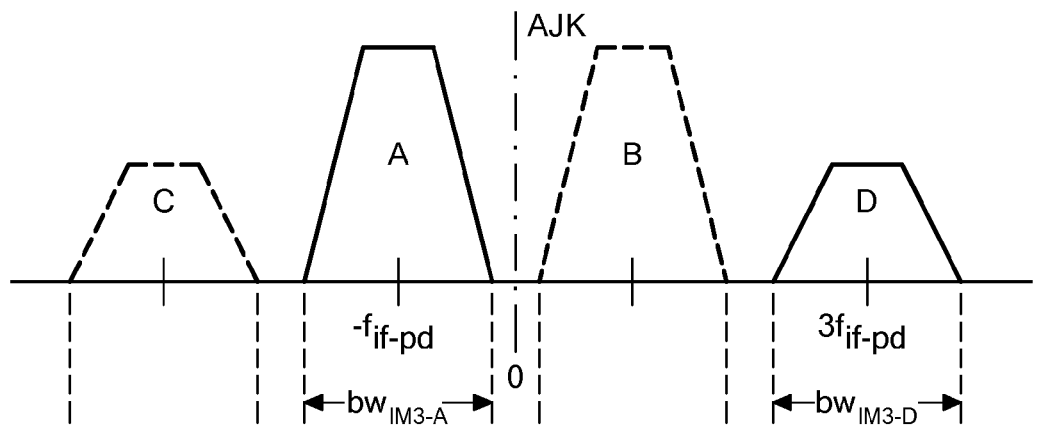
FIG. 9 is a diagram of the pre-distorted signal with signals in bands B and C suppressed.
Figure 10:
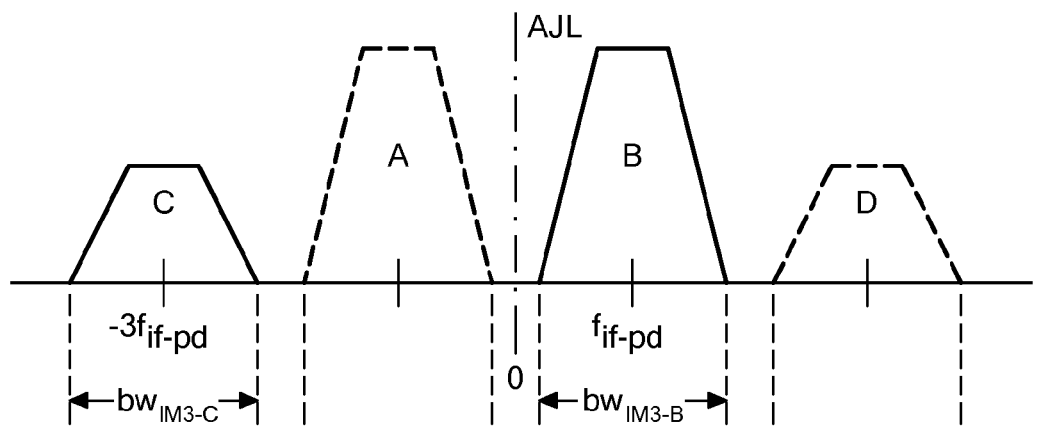
FIG. 10 is a diagram of the pre-distorted signal with signals in bands A and D suppressed.

FIG. 9 is an illustration of the signal AJK of FIG. 5, considering only third order non-linearities The dashed outline of the signals in bands C and B indicate that the signals in these bands are suppressed. FIG. 10 is an illustration of the signal AJL of FIG. 5, considering only third order non-linearities. The dashed outline of the signals in bands A and D are to indicate that the signals in these bands are suppressed. Thus, the signal AJK includes the energy in band A and band D and the signal AJL includes the energy in bands B and C. Thus, at the reference point AJK in FIG. 5, the bands are as follows:

Band $A$, centered at $f_{if\text{-}pd}$, span: $bw_{IM3\_A}=bw_1+2\max(bw_1,bw_2)$ (AU-01a)

Band $D$, centered at $3^*f_{if\text{-}pd}$, span: $bw_{IM3\_D}=bw_1+2bw_2$ (AU-04a)

At the reference point AJL in FIG. 5, the bands are as follows:

Band $C$, centered at $-3^*f_{if\text{-}pd}$, span: $bw_{IM3\_C}=2bw_1+bw_2$ (AU-03a)

Band $B$, centered at $f_{if\text{-}pd}$, span: $bw_{IM3\_B}=bw_2+2\max(bw_1,bw_2)$ (AU-02a)

FIG. 10 is an illustration of the signals of FIG. 9, where the signals of bands A and D are spaced close together. The spacing between the signals of bands A and D depend on the frequency chosen for $f_{if\text{-}pd}$. The bandwidth of band A is $BW_{IM3\_A}$ after pre-distortion and the bandwidth of band D is $BW_{IM3\_D}$. The frequency $f_{if\text{-}pd}$ must therefore be chosen to satisfy the following constraint:

$$4f_{if\text{-}pd,IM3\text{-}min} >= (BW_{IM3\text{-}A}+BW_{IM3\text{-}D})/2 \quad (AV\text{-}01)$$

This constraint is shown in FIG. 11a for bands A and D, where the interval labeled 1 is $(BW_{IM3\text{-}A})/2$, the interval labeled 2 is $(BW_{IM3\text{-}D})/2$ and the interval labeled 3 is given by:

$$4f_{if\text{-}pd,IM3\text{-}min}-(BW_{IM3\text{-}A}+BW_{IM3\text{-}D})/2$$

FIG. 11b shows aliasing that results from failure to meet the constraint of equation (AV-01). Choosing a smaller value of $f_{if\text{-}pd}$ will result in aliasing of the signals in bands A and D. Similarly, the bandwidth of band B is $BW_B$ after pre-distortion and the bandwidth of band C is $BW_C$. The frequency $f_{if\text{-}pd}$ must therefore be chosen to satisfy the following constraint:

$$4f_{if\text{-}pd\text{-}IM3\_min} >= (BW_{IM3\text{-}B}+BW_{IM3\text{-}C})/2 \quad (AV\text{-}02)$$

This constraint is shown in FIG. 12a for bands B and C, where the interval labeled 1 is $(BW_{IM3\text{-}C})/2$, the interval labeled 2 is $(BW_{IM3\text{-}B})/2$ and the interval labeled 3 is given by:

$$4f_{if\text{-}pd\,IM3\text{-}min}-(BW_{IM3\text{-}C}+BW_{IM3\text{-}B})/2$$

FIG. 12b shows aliasing that results from failure to meet the constraint of equation (AV-02). Choosing a smaller value of $f_{if\text{-}pd}$ will result in aliasing of the signals in bands B and C. Combining the constraints of equations (AV-01) and (AV-02) with equations (AU-01)-(AU-04) gives:

$$f_{if\text{-}pd,IM3\text{-}min} = (1/8)\max((bw_{IM3\_A}+bw_{IM3\_D}),(bw_{IM3\_B}+bw_{IM3\_C})) \quad (AV\text{-}03)$$
$$= (1/4)bw_1 + (1/4)bw_2 + (1/4)\max(bw_1, bw_2)$$

assuming $bw_2 >= bw_1$, (AV-03) takes the form (AV-04)

$$f_{if\text{-}pd,IM3\text{-}min} = (1/4)bw_1 + (1/2)bw_2$$

assuming $bw_2 = bw_1$, (AV-03) takes the form (AV-05)

$$f_{if\text{-}pd,IM3\text{-}min} = (3/4)bw_1$$

Figure 13:
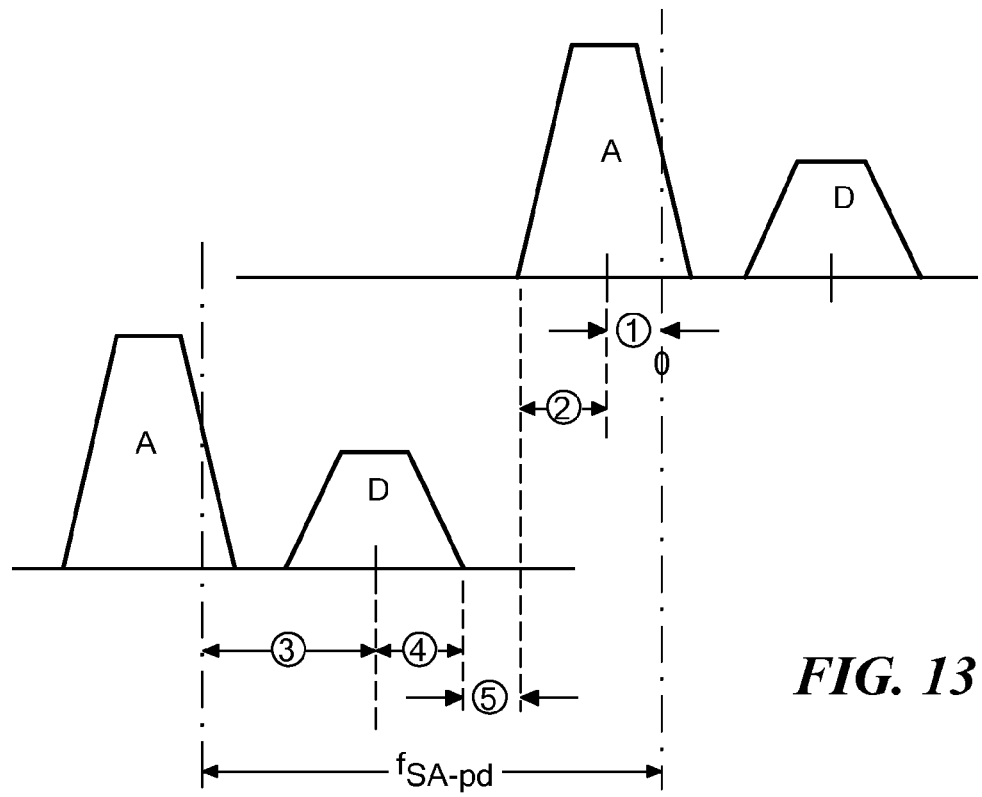
FIG. 13 is a diagram of the signals of FIG. 11 and one of the images of the signals.
Figure 14:
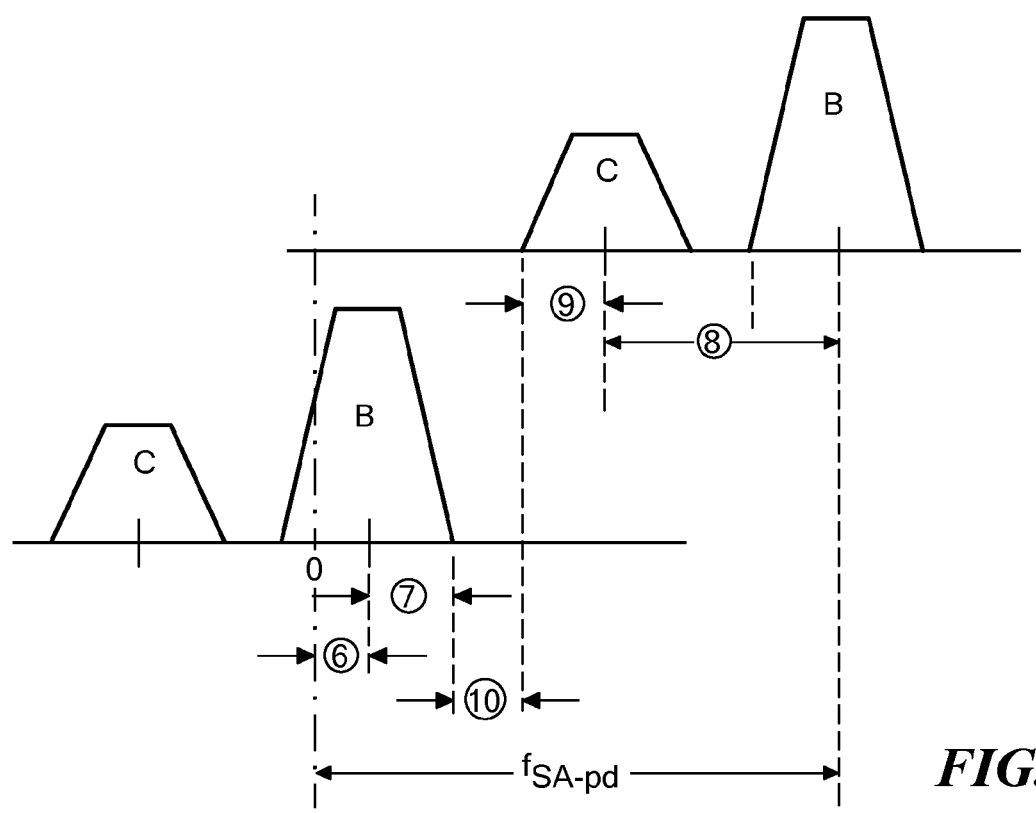
FIG. 14 is a diagram of the signals of FIG. 12 and one of the images of the signals.

In addition to constraints on $f_{if\text{-}pd}$, the sampling rate of the signals should also be constrained to avoid aliasing. Thus, FIG. 13 shows the original signal having bands A and D positioned close to an image of the signals of bands A and D. The sampling rate should be chosen so that the gap 5 between the signals is greater than zero. In FIG. 13 the following intervals are numbered 1-5:

1) $f_{if\text{-}pd}$
2) $(bw_{IM3\text{-}A})/2$
3) $3f_{if\text{-}pd}$
4) $(bw_{IM3\text{-}D})/2$
5) $f_{sa\text{-}pd}-4f_{if\text{-}pd}+(BW_{IM3\text{-}A}+BW_{IM3\text{-}D})/2$ This leads to the following condition:

$$f_{sa\text{-}pd\text{-}IM3\text{-}min}-4f_{if\text{-}pd} >= (BW_{IM3\text{-}A}+BW_{IM3\text{-}D})/2 \quad (AV\text{-}06)$$

where $f_{sa\text{-}pd}$ is the sampling rate of the pre-distorted signal. Similarly, FIG. 14 shows the original signal having bands B and C positioned close to an image of the signals of bands B and C. The sampling rate should be chosen so that the gap 10 between the signals is greater than zero. In FIG. 14 the following intervals are labeled 6-10:

6) $f_{if\text{-}pd}$
7) $(bw_{IM3\text{-}B})/2$
8) $3f_{if\text{-}pd}$
9) $(bw_{IM3\text{-}C})/2$
10) $f_{sa\text{-}pd}-4f_{if\text{-}pd}+(BW_{IM3\text{-}B}+BW_{IM3\text{-}C})/2$ This leads to the following condition:

$$f_{sa\text{-}pd\text{-}IM3\text{-}min}-4f_{if\text{-}pd} >= (BW_{IM3\text{-}B}+BW_{IM3\text{-}C})/2 \quad (AV\text{-}07)$$

Combining the constraints of equations (AV-03) and (AV-04) with equations (AU-01)-(AU-04) gives:

$$f_{sa\text{-}pd,IM3\text{-}min} = 4f_{if\text{-}pd} + (1/2)\max((bw_{IM3\_D}+bw_{IM3\_A}),(bw_{IM3\_C}+bw_{IM3\_B})) \quad (AV\text{-}12)$$
$$= 4f_{if\text{-}pd} + bw_1 + bw_2 + \max(bw_1, bw_2)$$

assuming $f_{if\text{-}pd}=f_{sa\text{-}pd,IM3\text{-}min}$, i.e., the minimum intermediate frequency is used, (AV-12) takes the form $$f_{sa\text{-}pd,IM3\text{-}min}=2bw_1+2bw_2+2\max(bw_1,bw_2)) \quad (AV\text{-}13)$$

further assuming $bw_2>=bw_1$, (AV-13) takes the form $$f_{sa\text{-}pd,IM3\text{-}min}=2bw_1+4bw_2 \quad (AV\text{-}14)$$

further assuming $bw_2=bw_1$, (AV-13) takes the form $$f_{sa\text{-}pd,IM3\text{-}min}=6bw_1 \quad (AV\text{-}15)$$

The constraints listed above are for pre-distortion for third order non-linearities. General expressions for higher order non-linearities are discussed below. For fifth order non-linearities, where signal energy is present in bands E, C, A, B, D, and F (from left to right), and where the desired signals are in bands A and B, the following holds true:

Band $A$, centered at $f_{c1}$, span: $bw_{IM5\_A}=bw_1++4\max(bw_1,bw_2)$ (AV-16)

Band $B$, centered at $f_{c2}$, span: $bw_{IM5\_B}=bw_2+4\max(bw_1,bw_2)$ (AV-17)

Band $C$, centered at $2*f_{c1}-f_{c2}$, span: $bw_{IM5\_C}=2bw_1+bw_2+2\max(bw_1,bw_2)$ (AV-18)

Band $D$, centered at $2*f_{c2}-f_{c1}$, span: $bw_{IM5\_D}=bw_1+2bw_2+2\max(bw_1,bw_2)$ (AV-19)

Band $E$, centered at $2*f_{c1}-f_{c2}$, span: $bw_{IM5\_E}=3bw_1+2bw_2$ (AV-20)

Band $F$, centered at $2*f_{c2}-f_{c1}$, span: $bw_{IM5\_F}=2bw_1+3bw_2$ (AV-21)

At the reference point AJK in FIG. 5, the bands are as follows:

Band $E$, centered at $-5*f_{if-pd}$, span: $bw_{IM5\_E}=3bw_1+2bw_2$

Band $A$, centered at $-f_{if-pd}$, span: $bw_{IM3\_A}=bw_1+2\max(bw_1,bw_2)$

Band $D$, centered at $3*f_{if-pd}$, span: $bw_{IM3\_D}bw_1+2bw_2$

At the reference point AJL in FIG. 5, the bands are as follows:

Band $C$, centered at $-3*f_{if-pd}$, span: $bw_{IM3\_C}=2bw_1+bw_2$

Band $B$, centered at $f_{if-pd}$, span: $bw_{IM3\_B}=bw_2+2\max(bw_1,bw_2)$

Band $F$, centered at $5*f_{if-pd}$, span: $bw_{IM5\_F}=2bw_1+3bw_2$ (AU-05)

To ensure separation of the bands, the constraints on the intermediate frequency $f_{if-pd}$ are as follows:

For separation of bands $E$ and $A$: $4f_{if-pd-IM5-min} \geq (BW_{IM5-E}+BW_{IM3-A})/2$ For separation of bands $A$ and $D$: $4f_{if-pd-IM5-min} \geq (BW_{IM5-A}+BW_{IM5-D})/2$ For separation of bands $C$ and $B$: $4f_{if-pd-IM5-min} \geq (BW_{IM5-C}+BW_{IM5-B})/2$ For separation of bands $B$ and $F$: $4f_{if-pd-IM5-min} \geq (BW_{IM5-B}+BW_{IM5-F})/2$ (AV-22)

Combining equations (AU-05) with equations (AV22) results in the following constraints.

$$f_{if-pd,IM5-min} = (1/8)\max((bw_{IM5\_E}+bw_{IM5\_A}),$$ (AV-26)
$$(bw_{IM5\_A}+bw_{IM5\_D}),$$
$$(bw_{IM5\_C}+bw_{IM5\_B}),$$
$$(bw_{IM5\_B}+bw_{IM5\_F}))$$
$$= (1/4)bw_1+(1/4)bw_2+$$
$$(3/4)\max(bw_1,bw_2)$$

assuming $bw_2 \geq bw_1$, (AV-26) takes the form (AV-27)
$$f_{if-pd,IM5-min}$$
$$=(1/4)bw_1+bw_2$$

assuming $bw_2=bw_1$, (AV-26) takes the form (AV-28)
$$f_{if-pd,IM5-min}$$
$$=(5/4)bw_1$$

Also, constraints on the minimum sampling rate $f_{sa-pd}$ to t avoid aliasing for fifth order non-linearities are as follows:

To avoid aliasing of bands $D$ and $A$: $f_{sa-pd-IM5-min} - 4f_{if-pd} \geq (BW_{IM5-D}+BW_{IM5-A})/2$ To avoid aliasing of bands $E$ and $A$: $f_{sa-pd-IM5-min} - 4f_{if-pd} \geq (BW_{IM5-E}+BW_{IM5-A})/2$ To avoid aliasing of bands $F$ and $B$: $f_{sa-pd-IM5-min} - 4f_{if-pd} \geq (BW_{IM5-F}+BW_{IM5-B})/2$ To avoid aliasing of bands $C$ and $B$: $f_{sa-pd-IM5-min} - 4f_{if-pd} \geq (BW_{IM5-C}+BW_{IM5-B})/2$ (AV-29)

Combining these results with the results of (AU-05) yields the following:

$$f_{sa-pd,IM5-min} = 4f_{if-pd} +$$ (AV-30)
$$(1/2)\max((bw_{IM5\_D}+bw_{IM5\_A}),$$
$$(bw_{IM5\_E}+bw_{IM5\_A}),$$
$$(bw_{IM5\_F}+bw_{IM5\_B}),$$
$$(bw_{IM5\_C}+bw_{IM5\_B}))$$
$$= 4f_{if-pd}+bw_1+bw_2+3\max(bw_1,bw_2)$$

assuming $f_{if-pd}=f_{sa-pd,IM5-min}$, i.e., the minimum intermediate frequency is used, and (AV-30) takes the form $$f_{sa-pd,IM5-min}=2bw_1+2bw_2+6\max(bw_1,bw_2))$$ (AV-31)

further assuming $bw_2 \geq bw_1$, (AV-30) takes the form $$f_{sa-pd,IM5-min}=2bw_1+8bw_2$$ (AV-32)

further assuming $bw_2=bw_1$, (AV-31) takes the form $$f_{sa-pd,IM5-min}=10bw_1$$ (AV-33)

For non-linearities of order $(4k+3)$, the non-linear function is of the form:

$$f(x)=\Sigma_{i=0}^{k}(c_{4i+1}x^{4i+1}+c_{4i+3}x^{4i+3})$$

the output of the pre-distorter contains frequencies in $4k+4$ bands, which have the following characteristics:

Band 1, centered at $f_{c1}$, span: $bw_{IM\{4k+3\}\_01}=$ (AX-01)
$$bw_1+(4k+2)*\max(bw_1,bw_2)$$

Band 2, centered at $f_{c2}$, span: $bw_{IM\{4k+3\}\_02}=$
$$bw_2+(4k+2)*\max(bw_1,bw_2)$$

Band 3, centered at $2*f_{c1}-f_{c2}$, span: $bw_{IM\{4k+3\}\_03}=$
$$2*bw_1+bw_2+(4k)*\max(bw_1,bw_2)$$

Band 4, centered at $2*f_{c2}-f_{c1}$, span: $bw_{IM\{4k+3\}\_04}=$
$$2*bw_2+bw_1+(4k)*\max(bw_1,bw_2)$$

...

Band$(4i+1)$, centered at $(2i+1)*f_{c1}-(2i)*f_{c2}$, span: $bw_{IM\{4k+3\}\_\{4i+1\}}=(2i+1)*bw_1+$
$$(2i)*bw_2+(4k-4i+2)*\max(bw_1,bw_2)$$

Band$(4i+2)$, centered at $(2i+1)*f_{c2}-(2i)*f_{c1}$, span: $bw_{IM\{4k+3\}\_\{4i+2\}}=(2i+1)*bw_2+$
$$(2i)*bw_1+(4k-4i+2)*\max(bw_1,bw_2)$$

Band$(4i+3)$, centered at $(2i+2)*f_{c1}-(2i+1)*f_{c2}$, span: $bw_{IM\{4k+3\}\_\{4i+3\}}=(2i+2)*bw_1+$
$$(2i+1)*bw_2+(4k-4i)*\max(bw_1,bw_2)$$

-continued

Band(4i + 4), centered at $(2i + 2) * f_{c2} - (2i + 1) * f_{c1}$, span: $bw_{IM\{4k+3\}\_\{4i+4\}} =$ $(2i + 2) * bw_2 + (2i + 1) * bw_1 + (4k - 4i) * \max(bw_1, bw_2)$

...

Band(4k + 1), centered at $(2k + 1) * f_{c1} - (2k) * f_{c2}$, span: $bw_{IM\{4k+3\}\_\{4k+1\}} =$ $(2k + 1) * bw_1 + (2k) * bw_2 + 2 * \max(bw_1, bw_2)$ Band(4k + 2), centered at $(2k + 1) * f_{c2} - (2k) * f_{c1}$, span: $bw_{IM\{4k+3\}\_\{4k+2\}} =$ $(2k + 1) * bw_2 + (2k) * bw_1 + 2 * \max(bw_1, bw_2)$ Band(4k + 3), centered at $(2k + 2) * f_{c1} - (2k + 1) * f_{c2}$, span: $bw_{IM\{4k+3\}\_\{4k+3\}} = (2k + 2) * bw_1 + (2k + 1) * bw_2$ Band(4k + 4), centered at $(2k + 2) * f_{c2} - (2k + 1) * f_{c1}$, span: $bw_{IM\{4k+3\}\_\{4k+4\}} = (2k + 2) * bw_2 + (2k + 1) * bw_1$ The signal at reference point AJK in FIG. 5 has the following characteristics:

Band 1, centered at $-f_{if\_pd}$, span: $bw_{IM\{4k+3\}\_01} =$     (AX-02)

$bw_1 + (4k + 2) * \max(bw_1, bw_2)$

Band 4, centered at $3 * f_{if\_pd}$, span: $bw_{IM\{4k+3\}\_04} =$ $2 * bw_2 + bw_1 + (4k) * \max(bw_1, bw_2)$

...

Band(4i + 1), centered at $-(4i + 1) * f_{if\_pd}$, span: $bw_{IM\{4k+3\}\_\{4i+1\}} =$ $(2i + 1) * bw_1 + (2i) * bw_2 + (4k - 4i + 2) * \max(bw_1, bw_2)$ Band(4i + 4), centered at $(4i + 3) * f_{if\_pd}$, span: $bw_{IM\{4k+3\}\_\{4i+4\}} =$ $(2i + 2) * bw_2 + (2i + 1) * bw_1 + (4k - 4i) * \max(bw_1, bw_2)$

...

Band(4k + 1), centered at $-(4k + 1) * f_{if\_pd}$, span: $bw_{IM\{4k+3\}\_\{4k+1\}} =$ $(2k + 1) * bw_1 + (2k) * bw_2 + 2 * \max(bw_1, bw_2)$ Band(4k + 4), centered at $(4k + 3) * f_{if\_pd}$, span: $bw_{IM\{4k+3\}\_\{4k+4\}} = (2k + 2) * bw_2 + (2k + 1) * bw_1$ The signal at reference point AJL in FIG. 5 has the following characteristics:

Band 2, centered at $f_{if\_pd}$, span: $bw_{IM\{4k+3\}\_02} =$     (AX-03)

$bw_2 + (4k + 2) * \max(bw_1, bw_2)$

Band 3, centered at $-3 * f_{if\_pd}$, span: $bw_{IM\{4k+3\}\_03} =$ $2 * bw_1 + bw_2 + (4k) * \max(bw_1, bw_2)$

...

Band(4i + 2), centered at $(4i + 1) * f_{if\_pd}$, span: $bw_{IM\{4k+3\}\_\{4i+2\}} =$ $(2i + 1) * bw_2 + (2i) * bw_1 + (4k - 4i + 2) * \max(bw_1, bw_2)$ Band(4i + 3), centered at $-(4i + 3) * f_{if\_pd}$, span: $bw_{IM\{4k+3\}\_\{4i+3\}} =$ $(2i + 2) * bw_1 + (2i + 1) * bw_2 + (4k - 4i) * \max(bw_1, bw_2)$

...

Band(4k + 2), centered at $(4k + 1) * f_{if\_pd}$, span: $bw_{IM\{4k+3\}\_\{4k+2\}} =$ $(2k + 1) * bw_2 + (2k) * bw_1 + 2 * \max(bw_1, bw_2)$ Band(4k + 3), centered at $-(4k + 3) * f_{if\_pd}$, span: $bw_{IM\{4k+3\}\_\{4k+3\}} = (2k + 2) * bw_1 + (2k + 1) * bw_2$ Assuming a sufficiently large sample rate, $f_{sa\_pd}$, the minimum intermediate frequency $4f_{if\_pd,IM\{4k+3\}\_min}$ for pre-distortion is given by the following constraints, for signals in bands 1, 2, 3, 4, 5 and 6, with desired signal energy in bands 1 and 2:

For separation of bands 5 and 1: $4f_{if\_pd,IM\{4k+3\}\_min} \geq (\frac{1}{2})(bw_{IM\{4k+3\}\_05} + bw_{IM\{4k+3\}\_01})$ For separation of bands 1 and 4: $4f_{if\_pd,IM\{4k+3\}\_min} \geq (\frac{1}{2})(bw_{IM\{4k+3\}\_01} + bw_{IM\{4k+3\}\_04})$ For separation of bands 3 and 2: $4f_{if\_pd,IM\{4k+3\}\_min} \geq (\frac{1}{2})(bw_{IM\{4k+3\}\_03} + bw_{IM\{4k+3\}\_02})$ For separation of bands 2 and 6: $4f_{if\_pd,IM\{4k+3\}\_min} \geq (\frac{1}{2})(bw_{IM\{4k+3\}\_02} + bw_{IM\{4k+3\}\_06})$     (AX-04)

where $bw_{IM\{4k+3\}\_01}$ is the band width of band 1, etc., and where the subscript IM denotes Intermodulation. For example, the subscript "IM3" refers to intermodulation up to the $3^{rd}$ order. Combining the results of equations (AX-01) with the results of equations (AX-04), in terms of the bandwidths of the signal in band A before pre-distortion and band B before pre-distortion, the results are as follows:

$$f_{id\_pd,IM\{4k+3\}\_min} \geq (\tfrac{1}{4})bw_1 + (\tfrac{1}{4})bw_2 + (k+\tfrac{1}{4})\max(bw_1, bw_2) \quad \text{(AX-05)}$$

where $bw_1$ is the bandwidth of band 1 before pre-distortion and $bw_2$ is the bandwidth of band 2 before pre-distortion. Assuming $bw_2 \gg bw_1$, (AX-05) takes the form $$f_{if\_pd,IM\{4k+3\}\_min} = (\tfrac{1}{4})bw_1 + (k+\tfrac{1}{2})bw_2 \quad \text{(AX-06)}$$

assuming $bw_2 = bw_1$, (AX-05) takes the form $$f_{if\_pd,IM\{4k+3\}\_min} = (k+\tfrac{3}{4})bw_1 \quad \text{(AX-07)}$$

For non-linearities of order (4k+3), the minimum sampling rate $f_{sa\_pd,\{4k+3\}\_min}$ for pre-distortion is given by the following constraints, for signals in bands 1, 2, 3, 4, 5, and 6, with desired signal energy in bands 1 and 2:

To avoid aliasing of bands 4k+4 of the image centered at $-f_{sa\_pd,\{4k+3\}\_min}$ and the signal of band 1:

$$f_{sa\_pd,\{4k+3\}\_min} - (4k+4)f_{if\_pd} \geq (\tfrac{1}{2})(bw_{IM\{4k+3\}\_\{4k+4\}} + bw_{IM\{4k+3\}\_01})$$

To avoid aliasing of bands 4k+3 of the image centered at $f_{sa\_pd,\{4k+3\}\_min}$ and the signal of band 2:

$$f_{sa\_pd,\{4k+3\}\_min} - (4k+4)f_{if\_pd} \geq (\tfrac{1}{2})(bw_{IM\{4k+3\}\_\{4k+3\}} + bw_{IM\{4k+3\}\_02}) \quad \text{(AX-08)}$$

Where $bw_{IM\{4k+3\}\_\{4k+3\}}$ is the bandwidth of band 4k+3. In terms of the bandwidth of the signals of bands A and B, before pre-distortion:

$$f_{sa\text{-}pd,IM\{4k+3\}\text{-}min} \geq (4k+4)f_{if\text{-}pd}+(k+1)bw_1+(k+1)bw_2+(2k+1)\max(bw_1,bw_2) \quad (AX\text{-}09)$$

where $bw_1$ is the bandwidth of band A before pre-distortion and $bw_2$ is the bandwidth of band B before pre-distortion.

Therefore, combining equations (AX-01) with equations (AX-08) and (AX-09), yields:

$$f_{sa\text{-}pd,IM\{4k+3\}\text{-}min} = (4k+4)f_{if\text{-}pd} + \quad (AX\text{-}10)$$
$$(1/2)\max((bw_{IM\{4k+3\}\_\{4k+4\}} + bw_{IM\{4k+3\}\_01}),(bw_{IM\{4k+3\}\_\{4k+3\}} + bw_{IM\{4k+3\}\_02}))$$
$$= (4k+4)f_{if\text{-}pd} + (k+1)bw_1 + (k+1)bw_2 + (2k+1)\max(bw_1,bw_2)$$

assuming $f_{if\text{-}pd}=f_{sa\text{-}pd,IM\{4k+3\}\text{-}min}$, i.e., the minimum intermediate frequency is used, (AX-10) takes the form $$f_{sa\text{-}pd,IM\{4k+3\}\text{-}min}=(2k+2)bw_1+(2k+2)bw_2+(4k^2+7k+2)\max(bw_1,bw_2)) \quad (AX\text{-}11)$$

further assuming $bw_2 \geq bw_1$, (AX-11) takes the form $$f_{sa\text{-}pd,IM\{4k+3\}\text{-}min}=(2k+2)bw_1+(4k^2+9k+4)bw_2 \quad (AX\text{-}12)$$

further assuming $bw_2=bw_1$, (AX-11) takes the form $$f_{sa\text{-}pd,IM\{4k+3\}\text{-}min}=(4k^2+11k+6)bw_1=(k+2)(4k+3)bw_1 \quad (AX\text{-}13)$$

For non-linearities of order (4k+5), the non-linear function is of the form:

$$\Sigma_{i=0}^{k}(c_{4i+1}x^{4i+1}+c_{4i+3}x^{4i+3})+c_{4k+5}x^{4k+5}$$

and the output of the pre-distorter contains frequencies in 4k+6 bands.

Band 1, centered at $f_{c1}$, span: $bw_{IM\{4k+5\}\_01} =$ (AY-01)
$$bw_1 + (4k+4)*\max(bw_1,bw_2)$$

Band 2, centered at $f_{c2}$, span: $bw_{IM\{4k+5\}\_02} =$
$$bw_2 + (4k+4)*\max(bw_1,bw_2)$$

Band 3, centered at $2*f_{c1}-f_{c2}$, span: $bw_{IM\{4k+5\}\_03} =$
$$2*bw_1 + bw_2 + (4k+2)*\max(bw_1,bw_2)$$

Band 4, centered at $2*f_{c2}-f_{c1}$, span: $bw_{IM\{4k+5\}\_04} =$
$$2*bw_2 + bw_1 + (4k+2)*\max(bw_1,bw_2)$$

...

Band$(4i+1)$, centered at $(2i+1)*f_{c1}-(2i)*f_{c2}$, span: $bw_{IM\{4k+5\}\_\{4i+1\}} =$
$$(2i+1)*bw_1 + (2i)*bw_2 + (4k-4i+4)*\max(bw_1,bw_2)$$

Band$(4i+2)$, centered at $(2i+1)*f_{c2}-(2i)*f_{c1}$, span: $bw_{IM\{4k+5\}\_\{4i+2\}} =$
$$(2i+1)*bw_2 + (2i)*bw_1 + (4k-4i+4)*\max(bw_1,bw_2)$$

-continued

Band$(4i+3)$, centered at $(2i+2)*f_{c1}-(2i+1)*f_{c2}$, span: $bw_{IM\{4k+5\}\_\{4i+3\}} = (2i+2)*bw_1 +$
$$(2i+1)*bw_2 + (4k-4i+2)*\max(bw_1,bw_2)$$

Band$(4i+4)$, centered at $(2i+2)*f_{c2}-(2i+1)*f_{c1}$, span: $bw_{IM\{4k+5\}\_\{4i+4\}} = (2i+2)*bw_2 +$
$$(2i+1)*bw_1 + (4k-4i+2)*\max(bw_1,bw_2)$$

...

Band$(4k+1)$, centered at $(2k+1)*f_{c1}-(2k)*f_{c2}$, span: $bw_{IM\{4k+5\}\_\{4k+1\}} =$
$$(2k+1)*bw_1 + (2k)*bw_2 + 4*\max(bw_1,bw_2)$$

Band$(4k+2)$, centered at $(2k+1)*f_{c2}-(2k)*f_{c1}$, span: $bw_{IM\{4k+5\}\_\{4k+2\}} =$
$$(2k+1)*bw_2 + (2k)*bw_1 + 4*\max(bw_1,bw_2)$$

Band$(4k+3)$, centered at $(2k+2)*f_{c1}-(2k+1)*f_{c2}$, span: $bw_{IM\{4k+5\}\_\{4k+3\}} =$
$$(2k+2)*bw_1 + (2k+1)*bw_2 + 2*(bw_1,bw_2)$$

Band$(4k+4)$, centered at $(2k+2)*f_{c2}-(2k+1)*f_{c1}$, span: $bw_{IM\{4k+5\}\_\{4k+4\}} =$
$$(2k+2)*bw_2 + (2k+1)*bw_1 + 2*\max(bw_1,bw_2)$$

Band$(4k+5)$, centered at $(2k+3)*f_{c1}-(2k+2)*f_{c2}$, span: $bw_{IM\{4k+5\}\_\{4k+5\}} = (2k+3)*bw_1 + (2k+2)*bw_2$ Band$(4k+6)$, centered at $(2k+3)*f_{c2}-(2k+2)*f_{c1}$, span: $bw_{IM\{4k+5\}\_\{4k+6\}} = (2k+3)*bw_2 + (2k+2)*bw_1$ The signal at reference point AJK in FIG. 5 has the following characteristics:

Band 1, centered at $-f_{if\text{-}pd}$, span: $bw_{IM\{4k+5\}\_01}=bw_1+(4k+4)*\max(bw_1,bw_2)$ Band 4, centered at $3*f_{if\text{-}pd}$, span: $bw_{IM\{4k+5\}\_04}=2*bw_2+bw_1(4k+2)*\max(bw_1,bw_2)$ ...

Band$(4i+1)$, centered at $-(4i+1)*f_{if\text{-}pd}$, span: $bw_{IM\{4k+5\}\_\{4i+1\}}=(2i+1)*bw_1+(2i)*bw_2+(4k-4i+4)*\max(bw_1,bw_2)$ Band$(4i+4)$, centered at $(4i+3)*f_{if\text{-}pd}$, span: $bw_{IM\{4k+5\}\_\{4i+4\}}=(2i+2)*bw_2+(2i+1)*bw_1+(4k-4i+2)*\max(bw_1,bw_2)$ Band$(4k+1)$, centered at $-(4k+1)*f_{if\text{-}pd}$, span: $bw_{IM\{4k+5\}\_\{4k+1\}}=(2k+1)*bw_1+(2k)*bw_2+4*\max(bw_1,bw_2)$ Band$(4k+4)$, centered at $(4k+3)*f_{if\text{-}pd}$, span: $bw_{IM\{4k+5\}\_\{4k+4\}}=(2k+2)*bw_2+(2k+1)*bw_1+2*\max(bw_1,bw_2)$ Band$(4k+5)$, centered at $-(4k+5)*f_{if\text{-}pd}$, span: $bw_{IM\{4k+5\}\_\{4k+5\}}=(2k+3)*bw_1+(2k+2)*bw_2$ (AY-02)

The signal at reference point AJL in FIG. 5 has the following characteristics:

Band 2, centered at $f_{if\text{-}pd}$, span: $bw_{IM\{4k+5\}\_02} =$ (AY-03)

$$bw_2 + (4k+4)*\max(bw_1, bw_2)$$

Band 3, centered at $-3*f_{if\text{-}pd}$, span: $bw_{IM\{4k+5\}\_03} =$ $$2*bw_1 + bw_2 + (4k+2)*\max(bw_1, bw_2)$$

...

Band$(4i+2)$, centered at $(4i+1)*f_{if\text{-}pd}$, span: $bw_{IM\{4k+5\}\_\{4i+2\}} =$ $$(2i+1)*bw_2 + (2i)*bw_1 + (4k-4i+4)*\max(bw_1, bw_2)$$

Band$(4i+3)$, centered at $-(4i+3)*f_{if\text{-}pd}$, span: $bw_{IM\{4k+5\}\_\{4i+3\}} = (2i+2)*bw_1 +$ $$(2i+1)*bw_2 + (4k-4i+2)*\max(bw_1, bw_2)$$

...

Band$(4k+2)$, centered at $(4k+1)*f_{if\text{-}pd}$, span: $bw_{IM\{4k+5\}\_\{4k+2\}} =$ $$(2k+1)*bw_2 + (2k)*bw_1 + 4*\max(bw_1, bw_2)$$

Band$(4k+3)$, centered at $-(4k+3)*f_{if\text{-}pd}$, span: $bw_{IM\{4k+5\}\_\{4k+3\}} =$ $$(2k+2)*bw_1 + (2k+1)*bw_2 + 2*\max(bw_1, bw_2)$$

Band$(4k+6)$, centered at $(4k+5)*f_{if\text{-}pd}$, span: $bw_{IM\{4k+5\}\_\{4k+6\}} = (2k+3)*bw_2 + (2k+2)*bw_1$ Assuming a sufficiently large sample rate, $f_{sa\text{-}pd}$, the minimum intermediate frequency $4f_{if\text{-}pd,IM(4k+5)\text{-}min}$ for pre-distortion is given by the following constraints, for signals in bands 1, 2, 3, 4, 5 and 6, with desired signal energy in bands 1 and 2:

For separation of bands 5 and 1: $4f_{if\text{-}pd,IM(4k+5)\text{-}min} \geq$
$(\tfrac{1}{2})(bw_{\{4k+5\}\_05} + bw_{\{4k+5\}\_01})$ For separation of bands 1 and 4: $4f_{if\text{-}pd,IM(4k+5)\text{-}min} \geq$
$(\tfrac{1}{2})(bw_{\{4k+5\}\_01} + bw_{\{4k+5\}\_04})$ For separation of bands 3 and 2: $4f_{if\text{-}pd,IM(4k+5)\text{-}min} \geq$
$(\tfrac{1}{2})(bw_{\{4k+5\}\_03} + bw_{\{4k+5\}\_02})$ For separation of bands 2 and 6: $4f_{if\text{-}pd,IM(4k+5)\text{-}min} \geq$
$(\tfrac{1}{2})(bw_{\{4k+5\}\_02} + bw_{\{4k+5\}\_06})$ (AY-04)

where $bw_{\{4k+5\}\_01}$ is the bandwidth of band 1, etc. Combining the results of equations (AY-01) with the results of equations (AY-04), in terms of the bandwidth of signal in band A before pre-distortion and Band B before pre-distortion, the results are as follows:

$f_{if\text{-}pd,IM\{4k+5\}\text{-}min} \geq (\tfrac{1}{4})bw_1 + (\tfrac{1}{4})bw_2 + (k+\tfrac{1}{4})\max(bw_1, bw_2)$ (AY-05a)

where $bw_{(4k+5)\_01}$ is the bandwidth of band 1, etc. In terms of the bandwidth of signals in bands 1 and 2 before pre-distortion $f_{if\text{-}pd,IM\{4k+5\}\text{-}min} \geq (\tfrac{1}{4})bw_1 + (\tfrac{1}{4})bw_2 + (k+\tfrac{3}{4})\max(bw_1, bw_2)$ (AY-05b)

assuming $bw_2 \geq bw_1$, (AY-05a) takes the form $f_{if\text{-}pd,IM(4k+5)\text{-}min} = (\tfrac{1}{4})bw_1 + (k+1)bw_2$ (AY-06)

assuming $bw_2 = bw_1$, (AY-05) takes the form $f_{if\text{-}pd,IM(4k+5)\text{-}min} = (k+5/4)bw_1$ (AY-07)

For non-linearities of order $(4k+5)$, the minimum sampling rate $f_{sa\text{-}pd,\{4k+5\}\text{-}min}$ for pre-distortion is given be the following constraints, for signals in bands 1, 2, 3, 4, 5, and 6, with desired signal energy in bands 1 and 2:

To avoid aliasing of bands $4k+4$ of the image centered at $f_{sa\text{-}pd,\{4k+5\}\text{-}min}$ and the signal of band 1:

$f_{sa\text{-}pd,\{4k+5\}\text{-}min} - (4k+4)f_{if\text{-}pd} \geq (\tfrac{1}{2})(bw_{\{4k+5\}\_\{4k+4\}} + bw_{\{4k+5\}\_01})$ To avoid aliasing of bands $4k+5$ of the image centered at $f_{sa\text{-}pd,\{4k+5\}\text{-}min}$ and the signal of band 1:

$f_{sa\text{-}pd,\{4k+5\}\text{-}min} - (4k+4)f_{if\text{-}pd} \geq (\tfrac{1}{2})(bw_{\{4k+5\}\_\{4k+5\}} + bw_{\{4k+5\}\_01})$ To avoid aliasing of bands $4k+6$ of the image centered at $f_{sa\text{-}pd,\{4k+3\}\text{-}min}$ and the signal of band 2:

$f_{sa\text{-}pd,\{4k+5\}\text{-}min} - (4k+4)f_{if\text{-}pd} \geq (\tfrac{1}{2})(bw_{\{4k+5\}\_\{4k+6\}} + bw_{\{4k+5\}\_02})$ To avoid aliasing of bands $4k+3$ of the image centered at $f_{sa\text{-}pd,\{4k+3\}\text{-}min}$ and the signal of band 2:

$f_{sa\text{-}pd,\{4k+5\}\text{-}min} - (4k+4)f_{if\text{-}pd} \geq (\tfrac{1}{2})(bw_{\{4k+5\}\_\{4k+3\}} + bw_{\{4k+5\}\_02})$ (AY-08)

where $bw_{\{4k+5\}\_\{4k+3\}}$ is the bandwidth of band $4k+3$, etc. In terms of the bandwidth of signals in bands 1 and 2 before pre-distortion:

$f_{sa\text{-}pd,IM\{4k+5\}\text{-}min} \geq (4k+4)f_{if\text{-}pd} + (k+1)bw_1 + (k+1)bw_2 + (2k+3)\max(bw_1, bw_2)$ (AY-09)

Therefore, $f_{sa\text{-}pd,IM\{4k+5\}\text{-}min} = (4k+4)f_{if\text{-}pd} + (\tfrac{1}{2})\max$
$((bw_{IM\{4k+5\}\_\{4k+4\}} + bw_{IM\{4k+5\}\_01}),$
$(bw_{IM\{4k+5\}\_\{4k+5\}} + bw_{IM\{4k+5\}\_01}),$
$(bw_{IM\{4k+5\}\_\{4k+6\}} + bw_{IM\{4k+5\}\_02}),$
$(bw_{IM\{4k+5\}\_\{4k+3\}} + bw_{IM\{4k+5\}\_02})) = (4k+4)$
$f_{if\text{-}pd} + (k+1)bw_1 + (k+1)bw_2 + (2k+3)\max(bw_1, bw_2)$ (AY-10)

assuming $f_{if\text{-}pd} = f_{sa\text{-}pd,IM\{4k+5\}\text{-}min}$, i.e., the minimum intermediate frequency is used, (AY-10) takes the form $f_{sa\text{-}pd,IM\{4k+5\}\text{-}min} = (2k+2)bw_1 + (2k+2)bw_2 + (4k^2+9k+6)\max(bw_1, bw_2))$ (AY-11)

further assuming $bw_2 \geq bw_1$, (AY10) takes the form $f_{sa\text{-}pd,IM\{4k+5\}\text{-}min} = (2k+2)bw_1 + (4k^2+11k+8)bw_2$ (AY-12)

further assuming $bw_2 = bw_1$, (23) takes the form $f_{sa\text{-}pd,IM\{4k+5\}\text{-}min} = (4k^2+13k+10)bw_1 = (k+2)(4k+5)bw_1$ (AY-13)

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of pre-distortion of dual band signals in a radio frequency (RF) front end, the method comprising:
   up-sampling first and second signals at a sampling rate based at least in part on a bandwidth of at least one of the first and second signals and an intermediate frequency, the intermediate frequency based at least in part on the bandwidth of the at least one of the first and second signals;
   tuning the first signal by minus the intermediate frequency to produce a first tuned signal; and
   tuning the second signal by plus the intermediate frequency to produce a second tuned signal;
   pre-distorting a sum of the first and second tuned signals to produce a first pre-distorted signal; and
   pre-distorting a difference of the first and second tuned signals to produce a second pre-distorted signal.

2. The method of claim 1, further comprising:
   adding the first and second pre-distorted signals to produce a third signal that substantially excludes the second signal; and
   subtracting the first and second pre-distorted signals to produce a fourth signal that substantially excludes the first signal.

3. The method of claim 2, further comprising:
   tuning the third signal by the intermediate frequency to produce a signal having the first signal substantially at baseband; and
   tuning the fourth signal by the intermediate frequency to produce a signal having the second signal substantially at baseband.

4. The method of claim 1, wherein the sampling rate is substantially equal to:

$$(4k+4)f_{if\text{-}pd}+(k+1)bw_1+(k+1)bw_2+(2k+1)\max(bw_1, bw_2)$$

where $bw_1$ is the bandwidth of the first signal before pre-distortion and $bw_2$ is the bandwidth of the second signal before pre-distortion, k indicates an order of compensation of a pre-distorter, and $f_{if\text{-}pd}$ is the intermediate frequency.

5. The method of claim 1, wherein the sampling rate is substantially equal to:

$$(4k+4)f_{if\text{-}pd}+(k+1)bw_1+(k+1)bw_2+(2k+3)\max(bw_1, bw_2)$$

where $bw_1$ is the bandwidth of the first signal before pre-distortion and $bw_2$ is the bandwidth of the second signal before pre-distortion, k indicates an order of compensation of a pre-distorter, and $f_{if\text{-}pd}$ is the intermediate frequency.

* * * * *